(12) United States Patent
Sim et al.

(10) Patent No.: US 11,844,214 B2
(45) Date of Patent: Dec. 12, 2023

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Jaeryong Sim, Suwon-si (KR); Giyong Chung, Seoul (KR); Dongsik Oh, Hwaseong-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/362,903

(22) Filed: Jun. 29, 2021

(65) Prior Publication Data
US 2022/0149060 A1   May 12, 2022

(30) Foreign Application Priority Data
Nov. 12, 2020   (KR) .......................... 10-2020-0150749

(51) Int. Cl.
*H10B 41/41* (2023.01)
*H10B 41/10* (2023.01)
(Continued)

(52) U.S. Cl.
CPC ........ *H10B 41/41* (2023.02); *H01L 29/40114* (2019.08); *H01L 29/40117* (2019.08); *H01L 29/42328* (2013.01); *H01L 29/42344* (2013.01); *H10B 41/10* (2023.02); *H10B 41/35* (2023.02); *H10B 43/10* (2023.02); *H10B 43/35* (2023.02); *H10B 43/40* (2023.02); *H01L 29/66825* (2013.01); *H01L 29/66833* (2013.01); *H01L 29/7889* (2013.01); *H01L 29/7926* (2013.01)

(58) Field of Classification Search
CPC ........................ H01L 21/823462; H10B 43/40
See application file for complete search history.

(56) References Cited

U.S. PATENT DOCUMENTS

| 6,884,682 | B2 | 4/2005 | Lee |
| 7,038,291 | B2 | 5/2006 | Goda et al. |

(Continued)

FOREIGN PATENT DOCUMENTS

| JP | 2008-016499 | 7/2006 |
| KR | 10-0815955 | 3/2008 |

*Primary Examiner* — Daniel P Shook
(74) *Attorney, Agent, or Firm* — CHAU & ASSOCIATES, LLC

(57) ABSTRACT

A semiconductor device includes a substrate that includes a first active region, a second active region, and an isolation region. An isolation layer pattern fills a trench in the substrate. A first gate insulation layer pattern and a first gate electrode structure are formed on the first active region. A second gate insulation layer pattern and second gate electrode structure are formed on the second active region. The first gate electrode structure includes a first polysilicon pattern, a second polysilicon pattern, and a first metal pattern. The second gate electrode structure includes a third polysilicon pattern, a fourth polysilicon pattern, and a second metal pattern. An upper surface of the isolation layer pattern is higher than upper surfaces of each of the first and third polysilicon patterns. A sidewall of each of the first and third polysilicon patterns contacts sidewalls of the isolation layer pattern.

19 Claims, 26 Drawing Sheets

(51) Int. Cl.
*H10B 41/35* (2023.01)
*H10B 43/10* (2023.01)
*H10B 43/35* (2023.01)
*H10B 43/40* (2023.01)
*H01L 29/423* (2006.01)
*H01L 21/28* (2006.01)
H01L 29/792 (2006.01)
H01L 29/66 (2006.01)
H01L 29/788 (2006.01)

(56) References Cited

U.S. PATENT DOCUMENTS

| | | |
|---|---|---|
| 7,211,484 B2 | 5/2007 | Lee et al. |
| 7,508,048 B2 | 3/2009 | Kang et al. |
| 7,618,863 B2 | 11/2009 | Nam |
| 2005/0106822 A1* | 5/2005 | Lee .................. H01L 27/105 |
| | | 438/294 |
| 2008/0081415 A1 | 4/2008 | Lee |
| 2010/0019307 A1 | 1/2010 | Nam |

* cited by examiner

SEMICONDUCTOR DEVICE AND METHOD OF MANUFACTURING THE SAME

CROSS-REFERENCE TO RELATED APPLICATION

This application claims priority under 35 USC § 119 from Korean Patent Application No. 10-2020-0150749, filed on Nov. 12, 2020 in the Korean Intellectual Property Office (KIPO), the contents of which me herein incorporated by reference in their entirety.

BACKGROUND

1. Technical Field

Embodiments of the disclosure are directed to a semiconductor device. In particular, embodiments of the disclosure are directed to a semiconductor device that includes peripheral circuits.

2. Discussion of the Related Art

A semiconductor device may have a cell on peripheral (COP) structure in which peripheral circuits are formed on a substrate and cell stacked structures that include the stacked memory cells are formed over on the peripheral circuits. Transistors that configure the peripheral circuits may be formed on the substrate so as to have target electric characteristics.

SUMMARY

Embodiments provide a semiconductor device, that has transistors that configure the peripheral circuits.

Embodiments provide a method for manufacturing a semiconductor device that has transistors that configure the peripheral circuits.

According to embodiments, there is provided a semiconductor device. The semiconductor device includes a substrate that includes a first active region, a second active region, and an isolation region that fills a trench between the first and second active regions, a first gate insulation layer pattern disposed on the substrate, a first gate electrode structure disposed on the first gate insulation layer pattern a second gate insulation layer pattern disposed on the substrate, and a second gate electrode structure disposed on the second gate insulation layer pattern. The first gate electrode structure extends in a first direction and crosses the first active region. The first gate electrode structure includes a first polysilicon pattern, a second polysilicon pattern, and a first metal pattern that are sequentially stacked. The second gate electrode structure extends in the first direction and crosses the second active region. The second gate electrode structure includes a third polysilicon pattern, a fourth polysilicon pattern, and a second metal pattern that are sequentially stacked. An upper surface of the isolation layer pattern is higher than an upper surface of each of the first and third polysilicon patterns. A sidewall of each of the first and third polysilicon patterns contacts a sidewall of the isolation layer pattern.

According to embodiments, there is provided a semiconductor device. The semiconductor device includes a substrate that includes a first region and a second region, an isolation layer pattern that fills a trench in at least a boundary region between the first and second regions, a first gate insulation layer pattern disposed on the first region of the substrate, a second gate insulation layer pattern disposed on the second region of the substrate, a first gate electrode structure disposed on the first gate insulation layer pattern, and a second gate electrode structure disposed on the second gate insulation layer pattern. An upper surface of the first region of the substrate is lower than the upper surface of the second region of the substrate. The first gate insulation layer pattern has a first thickness. The second gate insulation layer pattern has a second thickness that is less than the first thickness. The first gate electrode structure includes a first polysilicon pattern, a second polysilicon pattern, and a first metal pattern that are sequentially stacked. The second gate electrode structure includes a third polysilicon pattern, a fourth polysilicon pattern, and a second metal pattern that are sequentially stacked. An upper surface of the isolation layer pattern is disposed higher than an upper surface of each of the first and third polysilicon patterns. The second polysilicon pattern and the first metal pattern are disposed on an upper surface of the first polysilicon pattern and on an upper sidewall and on an upper surface of the isolation layer pattern. The fourth polysilicon pattern and the second metal pattern are disposed on an upper surface of the third polysilicon pattern and on the upper sidewall and on the upper surface of the isolation layer pattern.

According to embodiments, there is provided a semiconductor device. The semiconductor device includes a substrate that includes active regions and an isolation region at a trench between the active regions, wherein an isolation layer pattern fills the trench, a first gate insulation layer pattern disposed on a first region of the substrate, a first gate electrode structure disposed on the first gate insulation layer pattern, a second gate insulation layer pattern disposed on a second region of the substrate, a second gate electrode structure disposed on the second gate insulation layer pattern. The first gate electrode structure extends in a first direction and crosses at least one of the active regions. The first gate electrode structure includes a first polysilicon pattern, a second polysilicon pattern, and a first metal pattern that are sequentially stacked. The second gate electrode structure extends in the first direction and crosses at least one of the active regions. The second gate electrode structure includes a third polysilicon pattern, a fourth polysilicon pattern, and a second metal pattern that are sequentially stacked. Each of the first and third polysilicon patterns is cut by the isolation layer pattern. End portions in the first direction of the second polysilicon pattern and the first metal pattern are disposed on the upper surface of the isolation layer pattern. End portions in the first direction of the fourth polysilicon pattern and the second metal pattern are disposed on the upper surface of the isolation layer pattern.

According to embodiments, there is provided a method for manufacturing a semiconductor device. The method includes forming a first gate insulation layer that has a first thickness on a first region of a substrate; forming a second gate insulation layer that has a second thickness less than the first thickness on a second region of the substrate; forming a first polysilicon layer, a stopping layer, and an etching mask on the first and second gate insulation layers; etching the stopping layer, the first polysilicon layer, the first and second gate insulation layers, and an upper portion of the substrate using the etching mask to form a trench; forming an isolation layer pattern that fills the trench, where an upper surface of the isolation layer pattern is higher than an upper surface of the first polysilicon layer; selectively removing the stopping layer to expose an upper surface of the first polysilicon layer; conformally forming a second polysilicon layer and a metal layer on upper surfaces of the first polysilicon layer and the isolation layer pattern; and patterning the metal layer, the second polysilicon layer, and the first polysilicon layer to form a first gate electrode structure on the first gate insulation layer and a second gate electrode structure on the second gate insulation layer. The first gate electrode structure extends in a first direction. The first gate electrode structure includes a first polysilicon pattern, a second polysilicon pattern, and a first metal pattern. The second gate electrode structure extends in the first direction. The second gate electrode structure includes a third polysilicon pattern, a fourth polysilicon pattern, and a second metal pattern.

In a semiconductor device according to the embodiments, an upper surface of the isolation layer pattern is higher than upper surfaces of the first and third polysilicon patterns. The first and third polysilicon patterns are thin, and thus a parasitic capacitance due to the first and second gate electrode structures is decreased.

DETAILED DESCRIPTION

Hereinafter, a direction substantially perpendicular to an upper surface of the substrate is defined as a vertical direction, and two directions crossing with each other in horizontal directions substantially parallel to the upper surface of the substrate are defined as first and second directions, respectively. In embodiments, the first and second directions may be perpendicular to each other.

Herein, when one value is described as being about equal to another value, e.g. "a width may be from about 0.1 mm to about 1 mm", it is to be understood that the values are equal to each other to within a measurement error, or if measurably unequal, are close enough in value to be functionally equal to each other as would be understood by a person having ordinary skill in the art.

Figure 1:
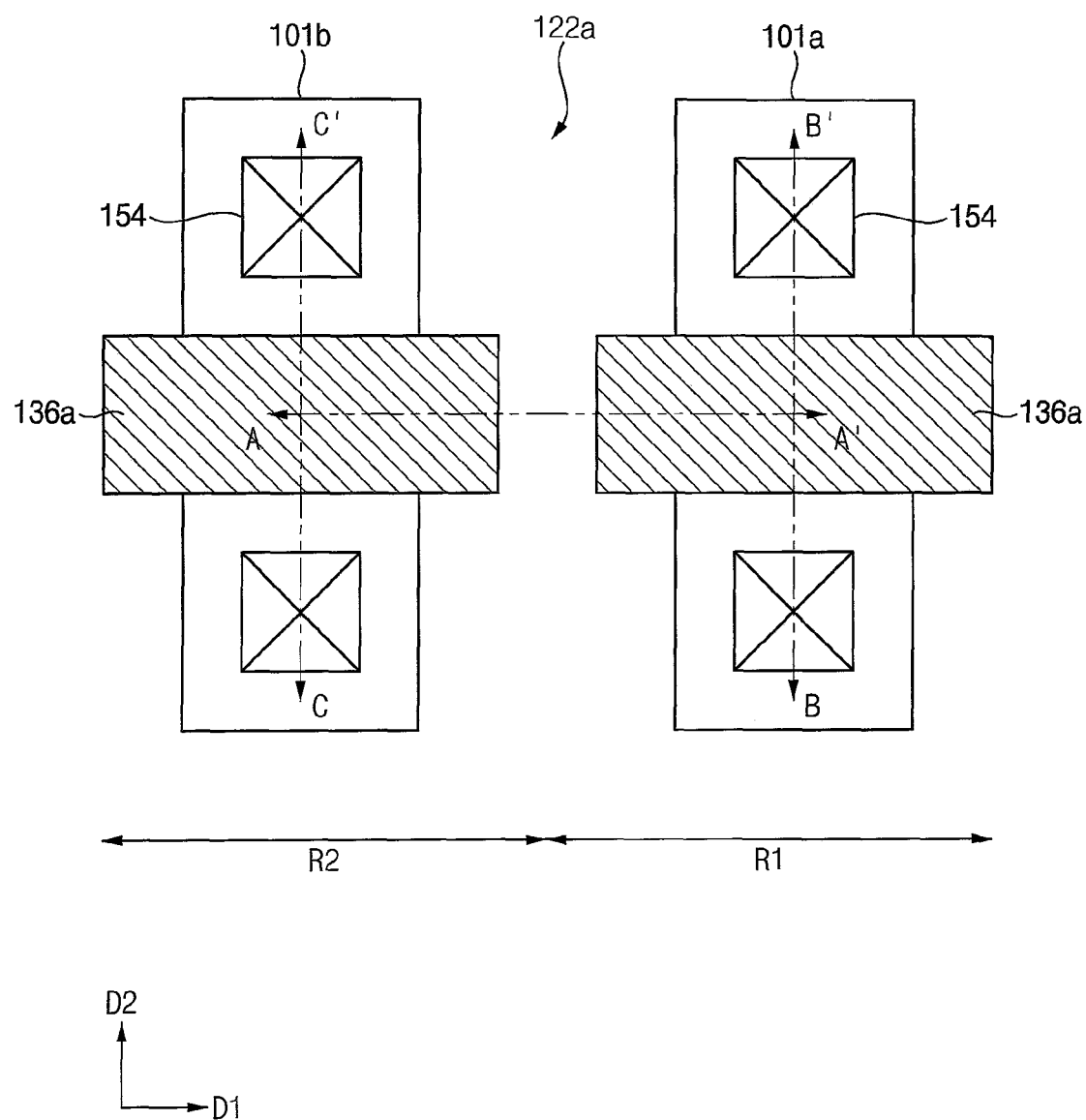
FIGS. 1 and 2 are a plan view and a cross-sectional view of a semiconductor device accordance with embodiments.
Figure 2:
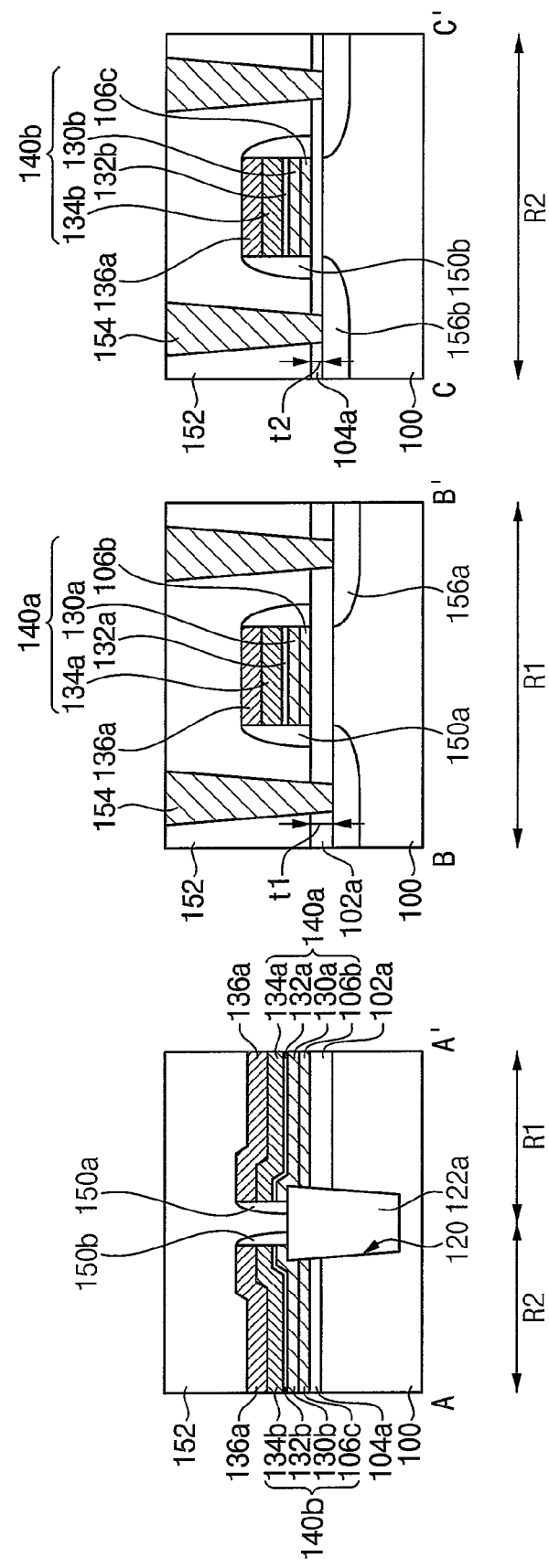

FIGS. 1 and 2 are a plan view and a cross-sectional view of a semiconductor device accordance with embodiments.

In particular, FIG. 2 includes cross-sectional views taken along lines A-A', B-B', and C-C' of FIG. 1. To avoid complicating the drawing, some elements, such as spacers, are not shown in FIG. 2.

Referring to FIGS. 1 and 2, in an embodiment, a semiconductor device includes a first transistor and a second transistor formed on a substrate 100.

In some embodiments, the first and second transistors are included in peripheral circuits for operating memory cells. The first transistor is a high voltage transistor that has a first operating voltage, and the second transistor is a low voltage transistor that has a second operating voltage lower than the first operating voltage.

In some embodiments, the substrate 100 includes a first region R1 in which the first transistors are formed and a second region R2 in which the second transistors are formed. That is, the first region R1 is a high voltage region, and the second region R2 is a low voltage region.

The substrate 100 includes a single silicon crystal. In some embodiments, the substrate 100 may be a silicon-on-insulator (SOI) substrate or a germanium-on-insulator (GOI) substrate.

In some embodiments, an upper surface of the first region R1 of the substrate 100 is lower than an upper surface of the second region R2 of the substrate 100. A step difference is formed at a boundary between the first region R1 and the second region R2 in the substrate 100.

In some embodiments, a first gate insulation layer pattern 102a is formed on the first region R1 of the substrate 100. The first gate insulation layer pattern 102a includes silicon oxide. The first gate insulation layer pattern 102a has a first thickness t1.

In some embodiments, a second gate insulation layer pattern 104a is formed on the second region R2 of the substrate 100. The second gate insulation layer pattern 104a includes silicon oxide. The second gate insulation layer pattern 104a has a second thickness t2 that is less than the first thickness t1.

In some embodiments, there is substantially no step difference between an upper surface of the first gate insulation layer pattern 102a and an upper surface of the second gate insulation layer pattern 104a. For example, the upper surface of the first gate insulation layer pattern 102a and the upper surface of the second gate insulation layer pattern 104a are substantially coplanar with each other.

In some embodiments, the first gate insulation layer pattern 102a is a gate oxide layer pattern of the first transistor. The second gate insulation layer pattern 104a is a gate oxide layer pattern of the second transistor.

In some embodiments, a first gate electrode structure 140a is formed on the first gate insulation layer pattern 102a. The first gate electrode structure 140a includes a first polysilicon pattern 106b, a second polysilicon pattern 130a, a first barrier metal pattern 132a, and a first metal pattern 134a that are sequentially stacked. A second hard mask pattern 136a is formed on the first gate electrode structure 140a. A first structure that includes the first gate electrode structure 140a and the second hard mask pattern 136a extends in the first direction D1.

In some embodiments, a stacked structure that is substantially the same as the first structure is formed on the second gate insulation layer pattern 104b. That is, a second gate electrode structure 140b is formed on the second gate insulation layer pattern 104b. The second gate electrode structure 140b includes a third polysilicon pattern 106c, a fourth polysilicon pattern 130b, a second barrier metal pattern 132b, and a second metal pattern 134b that are sequentially stacked. The second hard mask pattern 136a is formed on the second gate electrode structure 140b. A second structure that includes the second gate electrode structure 140b and the second hard mask pattern 136a extends in the first direction D1.

In some embodiments, the substrate 100 is divided into active regions 101a and 101b and a field region. An isolation trench 120 is formed in the field region of the substrate 100. An isolation layer pattern 122a fills the isolation trench 120, and an upper surface of the isolation layer pattern 122a protrudes from an upper surface of the substrate 100.

In some embodiments, the isolation trench 120 has a sidewall slope such that an inner width of the isolation trench 120 gradually decreases from top to bottom. In embodiments, the active regions 101a and 101b in which no isolation layer pattern 122a is formed have island shapes, respectively, and the active regions 101a and 101b are arranged lengthwise in the second direction. The first active region 101a is disposed in the first region R1 of the substrate 100, and the second active region 101b is disposed in the second region R2 of the substrate 100.

In some embodiments, the first structure crosses the first active region 101a, and end portions of the first structure in the first direction extend into the field region. The second structure crosses the second active region 101b, and end portions of the second structure in the first direction extend into the field region.

In some embodiments, the first polysilicon pattern 106b has a vertical thickness less than 40% of a vertical thickness of the first gate electrode structure 140a. The third polysilicon pattern 106c has a vertical thickness less than 40% of a vertical thickness of the second gate electrode structure 140b.

In some embodiments, the vertical thickness of the first polysilicon pattern 106b ranges from about 10% to about 40% of the vertical thickness of the first gate electrode structure 140a. The vertical thickness of the third polysilicon pattern 106c ranges from about 10% to about 40% of the vertical thickness of the second gate electrode structure 140b. For example, the vertical thickness of the first polysilicon pattern 106b ranges from about 15% to about 25% of the vertical thickness of the first gate electrode structure 140a, and the vertical thickness of the third polysilicon pattern 106c ranges from about 15% to about 25% of the vertical thickness of the second gate electrode structure 140b.

In some embodiments, each of the first and third polysilicon patterns 106b and 106c has a vertical thickness of about 100 Å to about 300 Å. For example, each of the first and third polysilicon patterns 106b and 106c has a vertical thickness of about 150 Å to about 250 Å.

In some embodiments, a sidewall of the first polysilicon pattern 106b in the first gate electrode structure 140a may contact a sidewall of the isolation layer pattern 122a. The sidewall of the first polysilicon pattern 106b contacts the sidewall of the isolation layer pattern 122a at end portions in the first direction of the first gate electrode structure 140a. The first polysilicon pattern 106b is not formed on an upper surface of the isolation layer pattern 122a. An upper surface and a lower surface of the first polysilicon pattern 106b are substantially flat, and the upper surface of the first polysilicon pattern 106b is lower than the upper surface of the isolation layer pattern 122a. The second polysilicon pattern 130a is formed on the upper surface of the first polysilicon pattern 106b and at an upper sidewall and on the upper surface of the isolation layer pattern 122a adjacent to the first polysilicon pattern 106b. The end portions in the first direction of the second polysilicon pattern 130a are disposed on the upper surface of the isolation layer pattern 122a. Further, the first barrier metal pattern 132a and the first metal pattern 134a are formed on the second polysilicon pattern 130a. End portions in the first direction of the first barrier metal pattern 132a and the first metal pattern 134a are disposed on the upper surface of the isolation layer pattern 122a.

In some embodiments, the first polysilicon patterns 106b and the second polysilicon pattern 130a are disposed on the first active region 101a of the substrate 100. In addition, only the second polysilicon pattern 130a is disposed on the field region. Since the first polysilicon pattern 106b and the second polysilicon pattern 130a include the same material, the first polysilicon pattern 106b and the second polysilicon pattern 130a can merge into one polysilicon structure. In this case, the polysilicon structure on the first active region 101a has a third thickness in the vertical direction. The polysilicon structure on the field region has a fourth thickness in the vertical direction that is less than the third thickness.

In some embodiments, as described above, the end portions in the first direction of the first gate electrode structure 140a are disposed on the upper surface of the isolation layer pattern 122a. The second polysilicon pattern 130a, the first barrier metal pattern 132a, and the first metal pattern 134a are exposed at sidewalls of the end portions in the first direction of the first gate electrode structure 140a.

In some embodiments, the second gate electrode structure 140b has a stacked structure that is substantially the same as that of the first gate electrode structure 140a. That is, a sidewall of the third polysilicon pattern 106c in the second gate electrode structure 140b contacts the sidewall of the isolation layer pattern 122a. The sidewall of the third polysilicon pattern 106c contacts the sidewall of the isolation layer pattern 122a at end portions in the first direction of the second gate electrode structure 140b.

In some embodiments, the third polysilicon pattern 106c in the second gate electrode structure 140b is not formed on the upper surface of the isolation layer pattern 122a. The fourth polysilicon pattern 130b is formed on an upper surface of the third polysilicon pattern 106c and at an upper sidewall and on an upper surface of the isolation layer pattern 122a adjacent to the third polysilicon pattern 106c. End portions in the first direction of the fourth polysilicon pattern 130b are disposed on the upper surface of the isolation layer pattern 122a. Further, the second barrier metal pattern 132b and the second metal pattern 134b are disposed on the fourth polysilicon pattern 130b. Thus, end portions in the first direction of the second barrier metal pattern 132b and the second metal pattern 134b are disposed on the isolation layer pattern 122a.

In some embodiments, the third polysilicon pattern 106c and the fourth polysilicon pattern 130b are formed on the second active region 101b of the substrate 100. In addition, only the fourth polysilicon pattern 130b may be disposed on the field region.

In some embodiments, the end portions in the first direction of the second gate electrode structure 140b are disposed on the upper surface of the isolation layer pattern 122a. The fourth polysilicon pattern 130b, the second barrier metal pattern 132b, and the second metal pattern 134b are exposed at a sidewall of the end portions in the first direction of the second gate electrode structure 140b.

In some embodiments, a first spacer 150a is formed on sidewalls of the first structure. A second spacer 150b is formed on sidewalls of the second structure. The first and second spacers 150a and 150b include an insulating material. The insulating material includes silicon oxide and/or silicon nitride.

In some embodiments, first impurity regions 156a are formed in the first active region 101a adjacent to both sides of the first gate electrode structure 140a in the second direction. The first impurity regions 156a serve as sources/drain regions. Second impurity regions 156b are formed at the second active region 101b adjacent to both sides of the second gate electrode structure 140b in the second direction. The second impurity regions 156b serve as sources/drain regions.

In some embodiments, a first insulating interlayer 152 is formed on the first gate insulation layer pattern 102a, the second gate insulation layer pattern 104a, and the isolation layer pattern 122a and covers the first structure and the second structure. The first insulating interlayer 152 includes silicon oxide.

In some embodiments, contact plugs 154 pass thorough the first insulating interlayer 152, and the contact plugs 154 contact the first and second impurity regions 156a and 156b, respectively. Each of the contact plugs 154 includes a barrier metal pattern and a metal pattern.

In some embodiments, as a distance between the first gate electrode structure 140a and the contact plugs 154 and a distance between the second gate electrode structure 140b and the contact plug 154 decreases, a parasitic capacitance between the first gate electrode structure 140a and the contact plugs 154 and a parasitic capacitance between the second gate electrode structure 140b and the contact plug 154 increases. However, in some embodiments, the vertical thicknesses of the first and third polysilicon patterns 106b and 106c are decreased, so that the vertical thicknesses of the first and second gate electrode structures 140a and 140b are decreased. Thus, a portion where the first gate electrode structure 140a and the contact plugs 154 face each other and a portion where the second gate electrode structure 140b and the contact plugs 154 face each other is reduced in size, so that the parasitic capacitance is decreased.

In some embodiments, the first transistor includes the first gate insulation layer pattern 102a, the first structure, and the first impurity regions 156a. The second transistor includes the second gate insulation layer pattern 104a, the second structure, and the second impurity regions 156b.

In some embodiments, the thickness of a portion adjacent to the isolation layer pattern of the first gate insulation layer pattern 102a is not relatively thinner or thicker than the thickness of other portion of the first gate insulation layer pattern 102a. In some embodiments, the thickness of a portion adjacent to the isolation layer pattern of the second gate insulation layer pattern 104a is not relatively thinner or thicker than the thickness of other portion of the second gate insulation layer pattern 104a. Thus, each of the first and second transistors has target electrical characteristics. Further, each of the first and second transistors has a low parasitic capacitance, and thus has excellent electrical characteristics.

Figure 3:
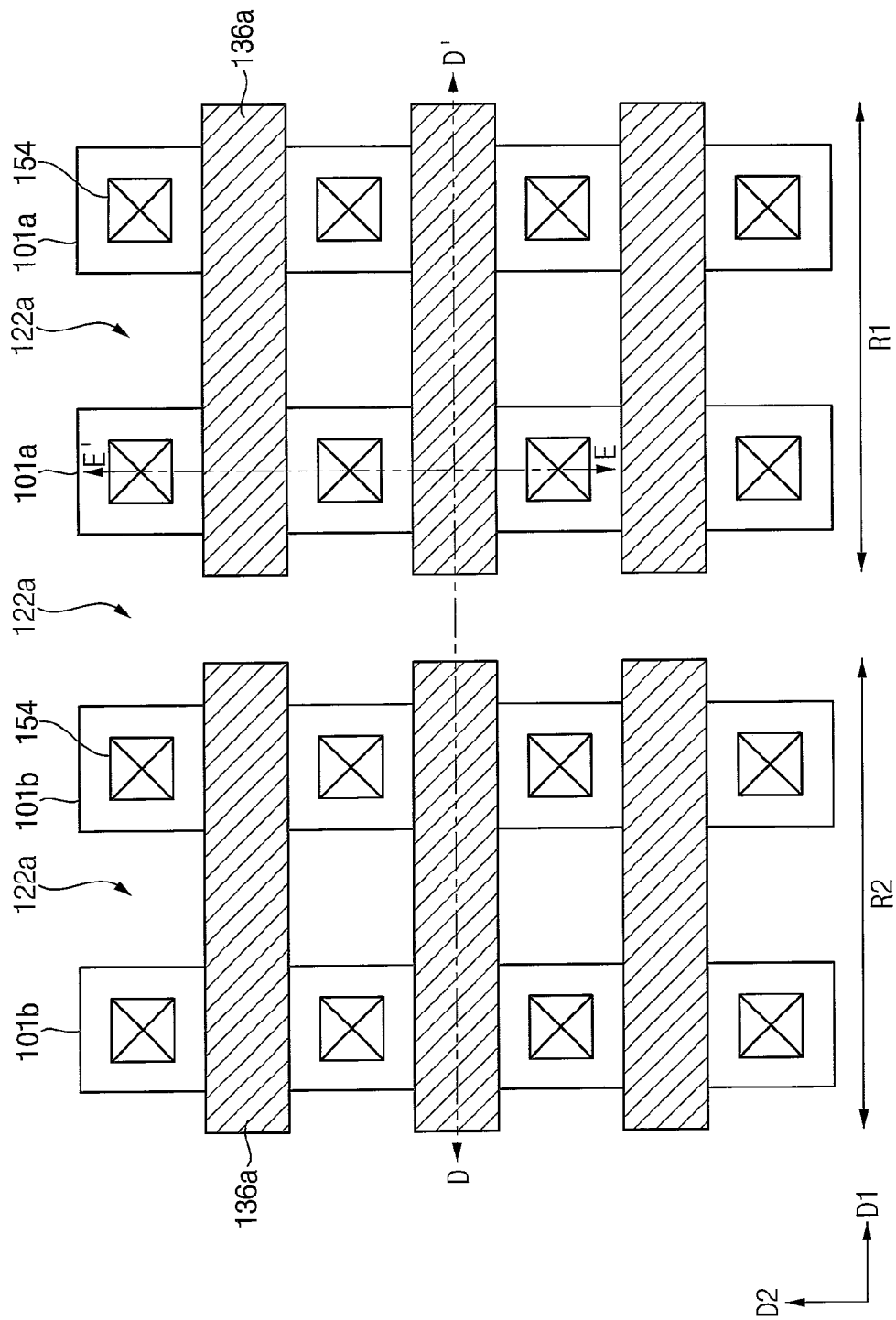
FIGS. 3, 4A, and 4B are, respectively, a plan view and cross-sectional views of semiconductor devices in accordance with embodiments.
Figure 4A:
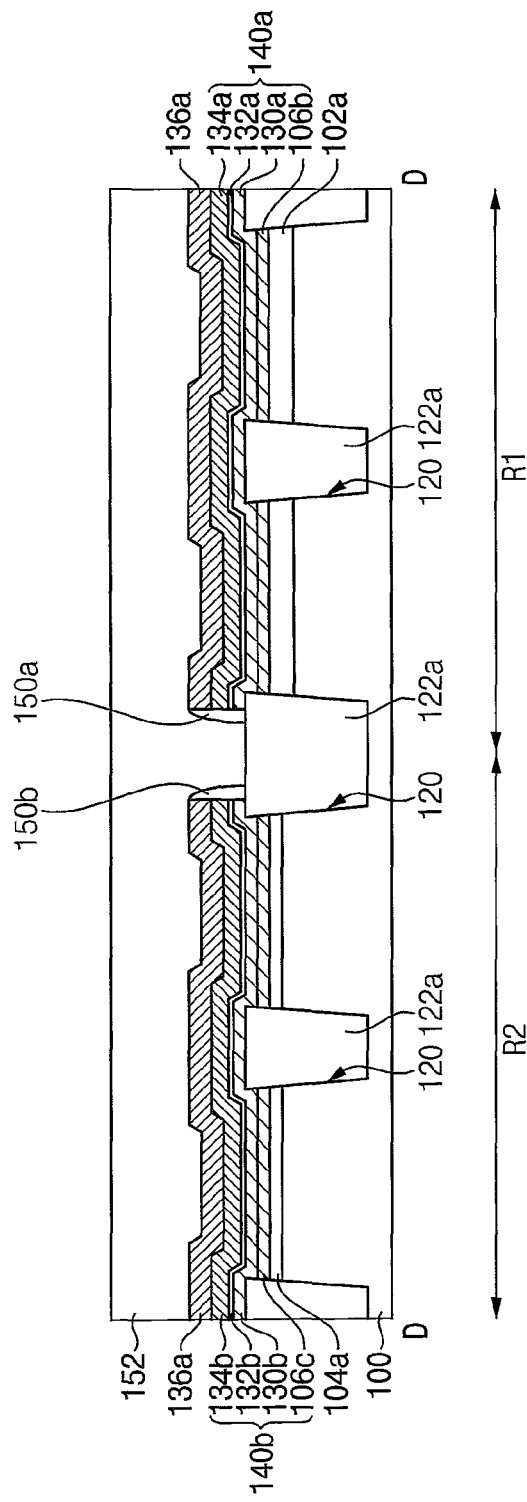
Figure 4B:
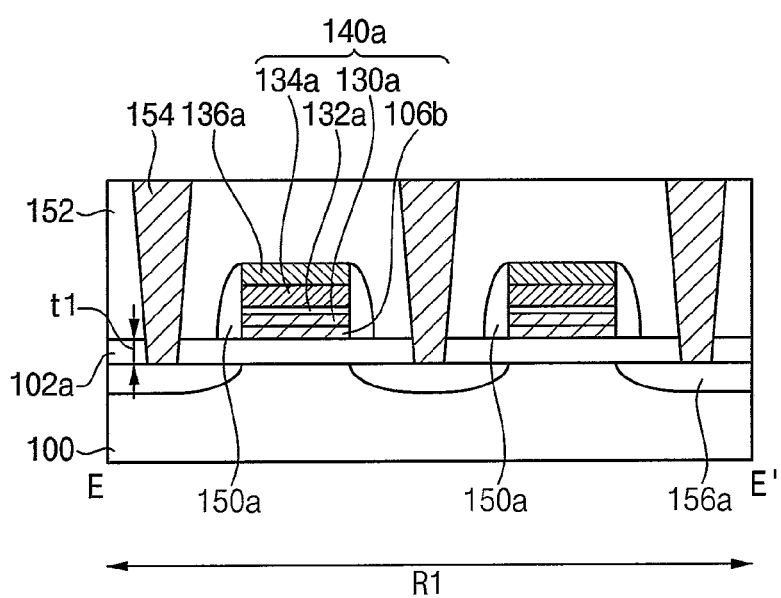

FIGS. 3, 4A, and 4B are, respectively, a plan view and cross-sectional views that illustrate semiconductor devices in accordance with embodiments.

In particular, FIG. 4A is a cross-sectional view taken along line D-D' of FIG. 3, and FIG. 4B is a cross-sectional view taken along line E-E' of FIG. 3.

FIG. 3 shows that the first and second transistors illustrated with reference to FIGS. 1 and 2 are arranged in an array form.

Referring to FIGS. 3, 4A and 4B, in some embodiments, the semiconductor device includes first transistors and second transistors formed on a substrate 100.

In some embodiments, the first transistors have a stacked structure that is the same as the stacked structure of the first transistor illustrated with reference to FIG. 1, and the second transistors has a stacked structure that is the same as the stacked structure of the second transistor described with reference to FIG. 1.

In particular, in some embodiments, the first gate insulation layer pattern 102a is formed on the first region R1 of the substrate 100. A first structure that includes the first gate electrode structure 140a and the second hard mask pattern 136a is formed on the first gate insulation layer pattern 102a. The first structure extends in the first direction D1. A plurality of first structures are spaced apart from each other in the second direction D2.

In some embodiments, a plurality of first active regions 101a in the first region R1 are spaced apart from each other in the first direction D1. An isolation layer pattern 122a is disposed between each of the plurality of first active regions 101a in the first direction D1. The first structure crosses each of the plurality of first active regions 101a spaced apart in the first direction, and the first structure extends in a first direction D1. Thus, the first structure is disposed on the upper surface of the isolation layer pattern 122a between the first active regions 101a in the first direction D1. First end portions of the first structure are disposed on the upper surface of the isolation layer pattern 122a.

In some embodiments, the first polysilicon pattern 106b has a vertical thickness that is less than 40% of a vertical thickness of the first gate electrode structure 140a.

In some embodiments, a sidewall of the first polysilicon pattern 106b in the first gate electrode structure 140a contacts a sidewall of the isolation layer pattern 122a. The first polysilicon pattern 106b is not formed on the upper surface of the isolation layer pattern 122a. Upper and lower surfaces of the first polysilicon pattern 106b are substantially flat, and the upper surface of the first polysilicon pattern 106b is lower than the upper surface of the isolation layer pattern 122a. That is, the first polysilicon pattern 106b has a shape cut by the isolation, layer patterns 122a.

In some embodiments, the second polysilicon pattern 130a, the first barrier metal pattern 132a, and the first metal pattern 134a in the first gate electrode structure 140a are formed on the upper surface of the first polysilicon pattern 106b and at the sidewalls and on the upper surface of the isolation layer pattern 122a. That is, the second polysilicon pattern 130a, the first barrier metal pattern 132a, and the first metal pattern 134a extend in the first direction D1, and the second polysilicon pattern 130a, the first barrier metal pattern 132a, and the first metal pattern 134a are not cut by the isolation layer patterns 122a.

In some embodiments, the second gate insulation layer pattern 104a is formed on the second region R2 of the substrate 100. A second structure that includes a second gate electrode structure 140b and a second hard mask pattern 136a is formed on the second gate insulation layer pattern 104a. The second structure extends in the first direction. A plurality of second structures are spaced apart from each other in the second direction.

In some embodiments, a stacked structure and an arrangement of the second gate electrode structures 140b is substantially the same as a stacked structure and an arrangement of the first gate electrode structures 140a. A sidewall of the third polysilicon pattern 106c in the second gate electrode structure 140b contacts the sidewall of the isolation layer pattern 122a. The third polysilicon pattern 106c has a shape cut by the isolation layer patterns 122a.

In some embodiments, a first spacer 150a is formed on sidewalls of the first structures. A second spacer 150b is formed on sidewalls of the second structures.

In some embodiments, first impurity regions 156a are formed in the first active region 101a adjacent to both sides in the second direction of the first gate electrode structure 140a. The first impurity regions 156a are sources/drain regions. Second impurity regions are formed in the second active regions 101b adjacent to both sides in the second direction of the second gate electrode structure 140b. The second impurity regions are sources/drain regions.

In some embodiments, a first insulating interlayer 152 is formed on the first gate insulation layer patient 102a and the second gate insulation layer pattern 104a and covers the first structure and the second structure. Contact plugs 154 are formed through the first insulating interlayer 152, and the contact plugs 154 contact the first and second impurity regions 156a, 156b, respectively.

In some embodiments, as vertical thicknesses of the first and third polysilicon patterns 106b and 106c are decreased, the vertical thicknesses of the first and second gate electrode structures 140a and 140b are decreased. Thus, a portion where the first gate electrode structure 140a and the contact plugs 154 face each other and a portion where the second gate electrode structure 140b and the contact plugs 154 face each other is reduced in size, so that a parasitic capacitance may be decreased.

FIGS. 5 to 16 are cross-sectional views that illustrate a method of manufacturing a semiconductor device in accordance with embodiments.

Each of ICIS. 5 to 16 includes cross-sectional views taken along lines A-A', B-B', and C-C' of FIG. 1, respectively.

Figure 5:
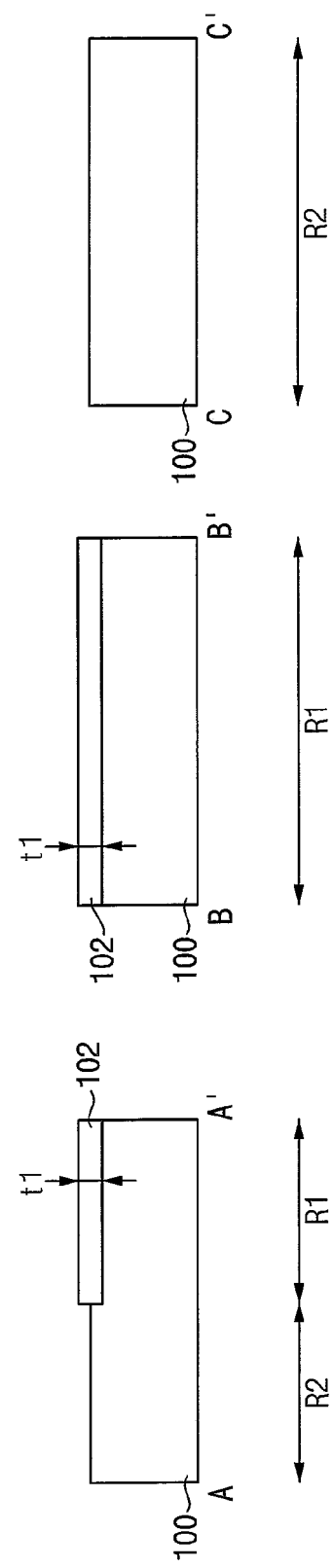
FIGS. 5 to 16 are cross-sectional views that illustrate a method of manufacturing a semiconductor device in accordance with embodiments.

Referring to FIG. 5, in some embodiments, a substrate 100 includes a first region R1 and a second region R2. An etch mask pattern is formed to cover the second region R2 of the substrate 100. The first region R1 of the substrate 100 is etched using the etch mask pattern. Thus, an upper surface of the first region R1 of the substrate 100 is lower than an upper surface of the second region R2 of the substrate 100. A step difference occurs at a boundary between the first region R1 and the second region R2 in the substrate 100.

In some embodiments, an ion implantation process is performed on the first region R1 and the second region R2 of the substrate 100 of to form well regions of the subsequently formed first and second transistors.

In some embodiments, a first gate insulation layer 102 is formed on the first and second regions R1 and R2 of the substrate 100. In embodiments, the first gate insulation layer 102 is formed by oxidizing a surface of the substrate 100.

In some embodiments, the first gate insulation layer 102 has a first thickness t1 in a vertical direction from the surface of the substrate 100.

In some embodiments, a height (or, level) of an upper surface of the first gate insulation layer 102 formed on the first region R1 of the substrate 100 is the same as or slightly higher than a height (or, level) of an upper surface of the second region R2 of the substrate 100.

Thereafter, in some embodiments, an etching mask pattern is formed to cover the first gate insulation layer 102 on the first region R1 of the substrate 100. The first gate insulation layer 102 formed on the second region of the substrate 100 R2 is etched using the etching mask pattern. Thus, the surface of the second region R2 of the substrate 100 is exposed. The first gate insulation layer 102 remains only on the first region R1 of the substrate 100.

Figure 6:
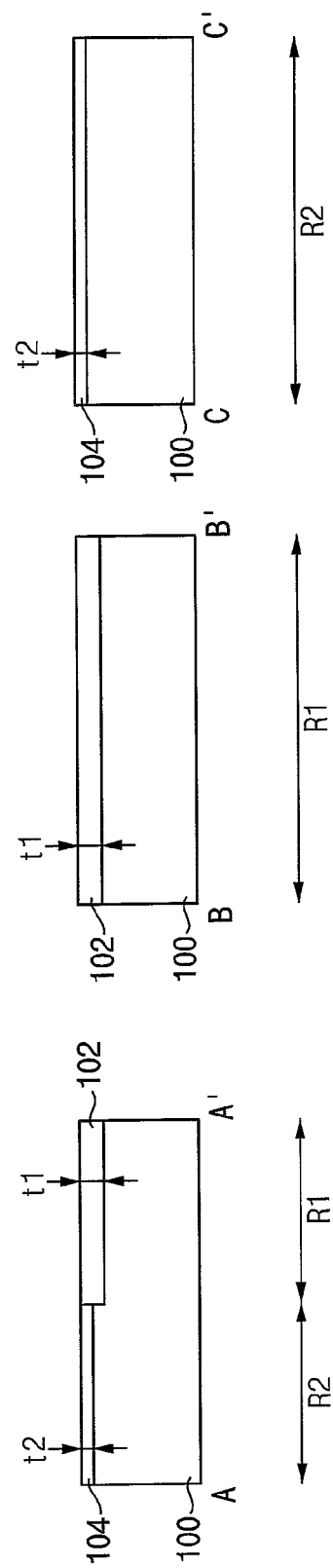

Referring to FIG. 6, in some embodiments, a second gate insulation layer 104 is formed on the second region R2 of the substrate 100. In embodiments, the second gate insulation layer 104 is formed by oxidizing the surface of the substrate 100. In this case, the first gate insulation layer 102 covers the first region R1 of the substrate 100 of, so that the first region R1 of the substrate 100 is not exposed. Thus, the second gate insulation layer 104 is formed only on the second region R2 of the exposed substrate 100.

In some embodiments, the second gate insulation layer 104 has a second thickness t2 in a vertical direction front the surface of the substrate 100, and the second thickness t2 is less than the first thickness t1.

In some embodiments, there is substantially no step difference between an upper surface of the first gate insulation layer 102 and an upper surface of the second gate insulation layer 104. That is, the upper surface of the first gate insulation layer 102 and the upper surface of the second gate insulation layer 104 are substantially coplanar with each other.

In some embodiments, the first gate insulation layer 102 is a gate oxide layer pattern of the first transistor through subsequent processes. The second gate insulation layer 104 is a gate oxide layer pattern of the second transistor through subsequent processes.

In some embodiments, the first and second gate insulation layers 102 and 104 each include silicon oxide. Thus, the first and second gate insulation layers 102 and 104 can be merged with each other so that a boundary between the first and second gate insulation layers 102 and 104 is not distinguishable.

Figure 7:
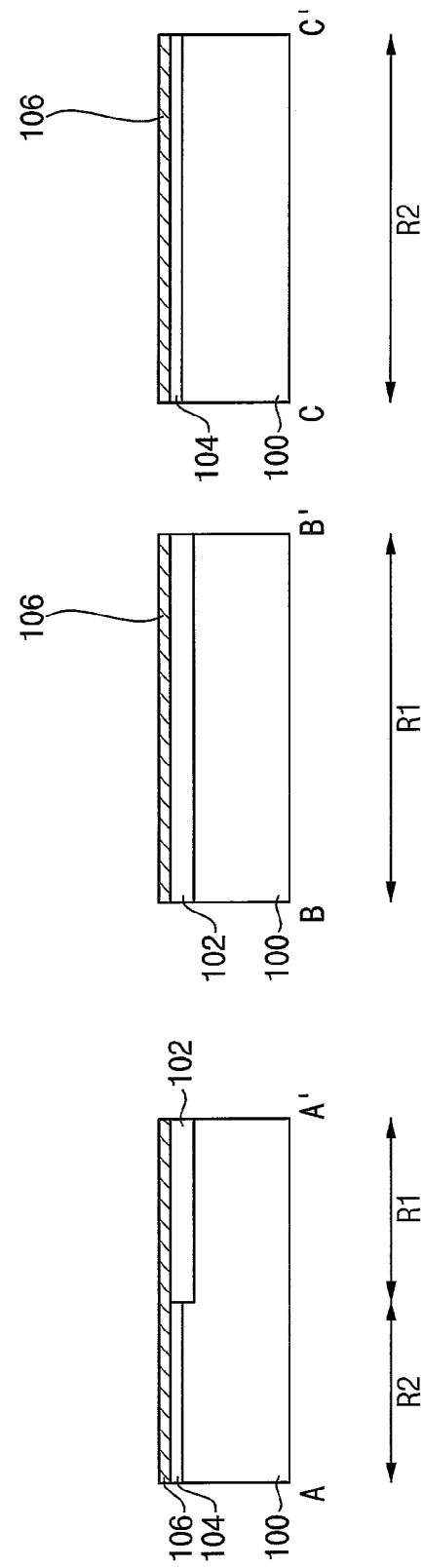

Referring to FIG. 7, in some embodiments, a first polysilicon layer 106 is formed on the first and second gate insulation layers 102 and 104. The first polysilicon layer 106 covers the first and second gate insulation layers 102 and 104, so that the first and second gate insulation layers 102 and 104 are not exposed during subsequent processes. Thus, the first and second gate insulation layers 102 and 104 are protected by the first polysilicon layer 106. The first polysilicon layer 106 serves as parts of gate electrodes of the first and second transistors.

In some embodiments, the first polysilicon layer 106 is in an amorphous state when a deposition process is performed. However, the first polysilicon layer 106 crystallizes while subsequent processes are performed after the deposition process.

In some embodiments, the subsequent processes form a first gate electrode structure of the first transistor in which gate electrodes are stacked, and a second gate electrode structure of the second transistor in which gate electrodes are stacked. The first polysilicon layer 106 is formed to have a vertical thickness that is less than about 40% of the vertical thickness of each of the first and second gate electrode structures. In some embodiments, the vertical thickness of the first polysilicon layer 106 is from about 10% to about 40% of the vertical thickness of each of the first and second gate electrode structures. For example, the vertical thickness of the first polysilicon layer 106 is from about 15% to about 25% of the vertical thickness of each of the first and second gate electrode structures.

In some embodiments, the first polysilicon layer 106 has a vertical thickness of from about 100 Å to about 300 Å. When the vertical thickness of the first polysilicon layer 106 is less than about 100 Å, it may be challenging to control the doping of impurities into the first polysilicon layer 106 in subsequent processes. Further, it may be challenging for the first polysilicon layer 106 to protect the first and second gate insulation layers 102 and 104. When the vertical thickness of the first polysilicon layer 106 is greater than about 300 Å, a total height of each of the first and second gate electrode structures is increased. Thus, a parasitic capacitance, such as a parasitic capacitance between the gate electrode and the contact plug, or a parasitic capacitance between the gate electrodes, can increase. For example, the first polysilicon layer 106 has the vertical thickness of from about 150 Å to about 250 Å. As described above, the first polysilicon layer 106 is very thin.

Figure 8:
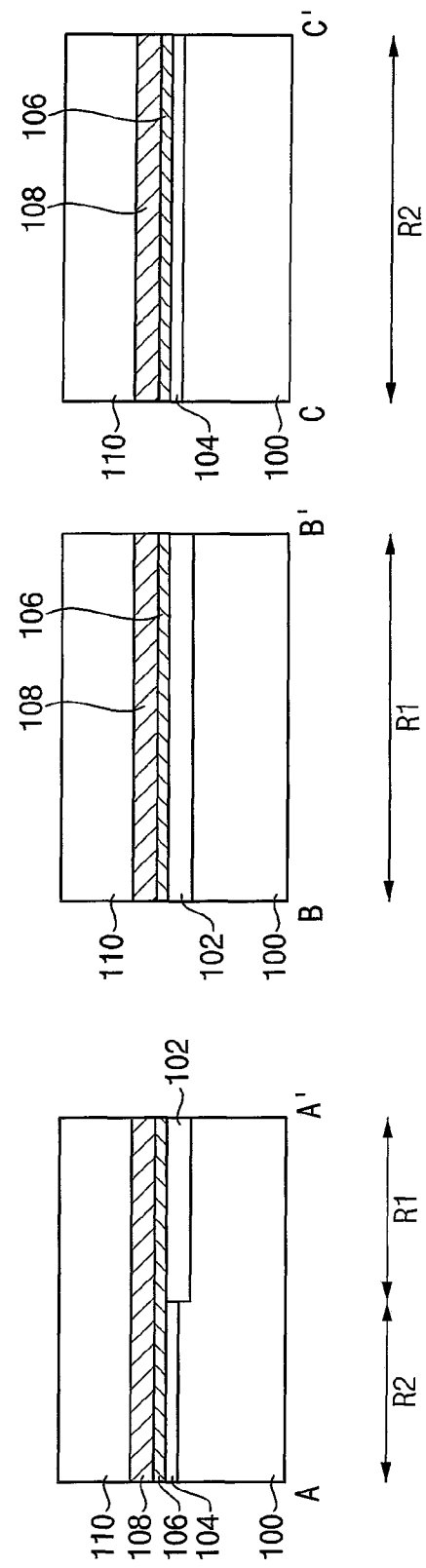

Referring to FIG. 8, in some embodiments, a stopping layer 108 is formed on the first polysilicon layer 106. The stopping layer 108 is a polishing stop layer pattern for a subsequent planarization process that forms an isolation layer pattern.

In some embodiments, the stopping layer 108 includes a material that has a high etch selectivity with respect to the first polysilicon layer 106. In a subsequent etching process, the material of the stopping layer 108 is selectively etched, and the first polysilicon layer 106 is substantially unetched. Further, the material of the stopping layer 108 is used as the polishing stop layer in the subsequent planarization process of silicon oxide. In some embodiments, the stopping layer 108 includes, e.g. silicon nitride.

In some embodiments, a first hard mask layer 110 is formed on the stopping layer 108. The first hard mask layer 110 includes, e.g., silicon oxide.

Figure 9:
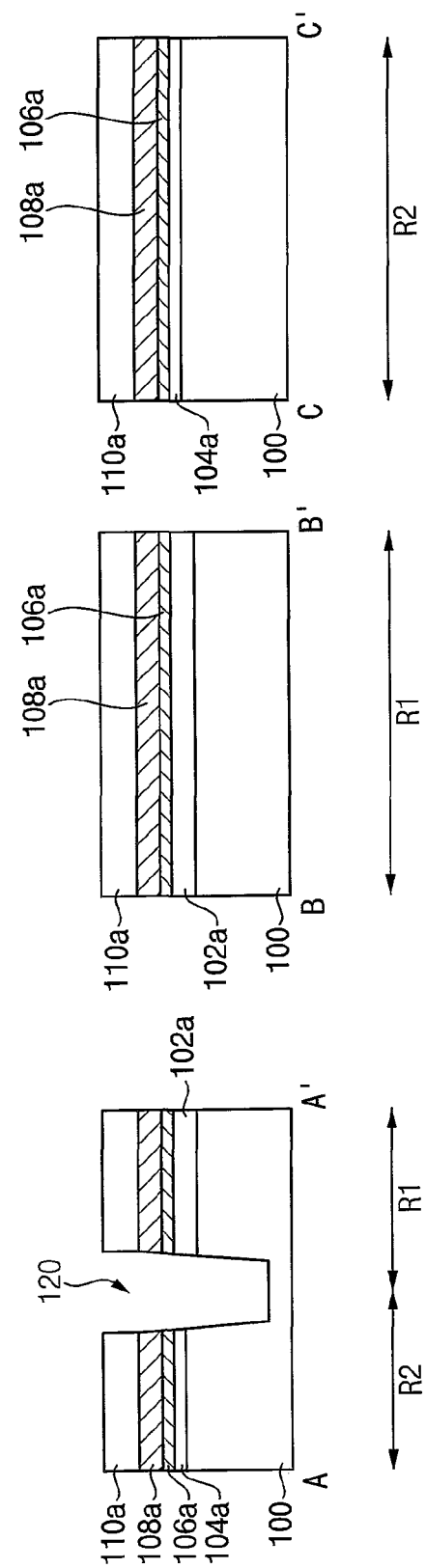

Referring to FIG. 9, in some embodiments, the first hard mask layer 110 is patterned by a photolithography process to form a first hard mask pattern 110a. The first hard mask pattern 110a exposes an upper portion of a field region of the substrate 100, and covers upper portions of first and second active regions.

In some embodiments, the first hard mask pattern 110a exposes at least a boundary region between the first and second regions R1 and R2. Thus, the boundary region between the first and second regions R1 and R2 corresponds to the field region.

In some embodiments, the stopping layer 108, the first polysilicon layer 106, the first and second gate insulation layers 102 and 104, and an upper portion of the substrate 100 are sequentially and anisotropically etched using the first hard mask pattern 110a as an etching mask to form an isolation trench 120. During the anisotropic etching process, the first hard mask pattern 110a is partially etched. Thus, a thickness of the first hard mask pattern 110a after forming the isolation trench 120 is less than a thickness of the first hard mask layer 110 before forming the isolation trench 120.

In some embodiments, when the isolation trench 120 is thrilled by the anisotropic etching process, the isolation trench 120 has a sidewall slope such that an inner width of the isolation trench 120 gradually decreases from top to bottom.

In some embodiments, in a process of forming the isolation trench 120, portions of the stopping layer 108, the first polysilicon layer 106, and the first and second gate insulation layers 102 and 104 are etched to form a stopping layer pattern 108a, a preliminary first polysilicon pattern 106a, and first and second gate insulation layer patterns 102a and 104a.

In some embodiments, sidewalls of the stopping layer pattern 108a, the preliminary first polysilicon pattern 106a, and the first and second gate insulation layer patterns 102a and 104a are exposed by an upper sidewall of the isolation trench 120.

Figure 10:
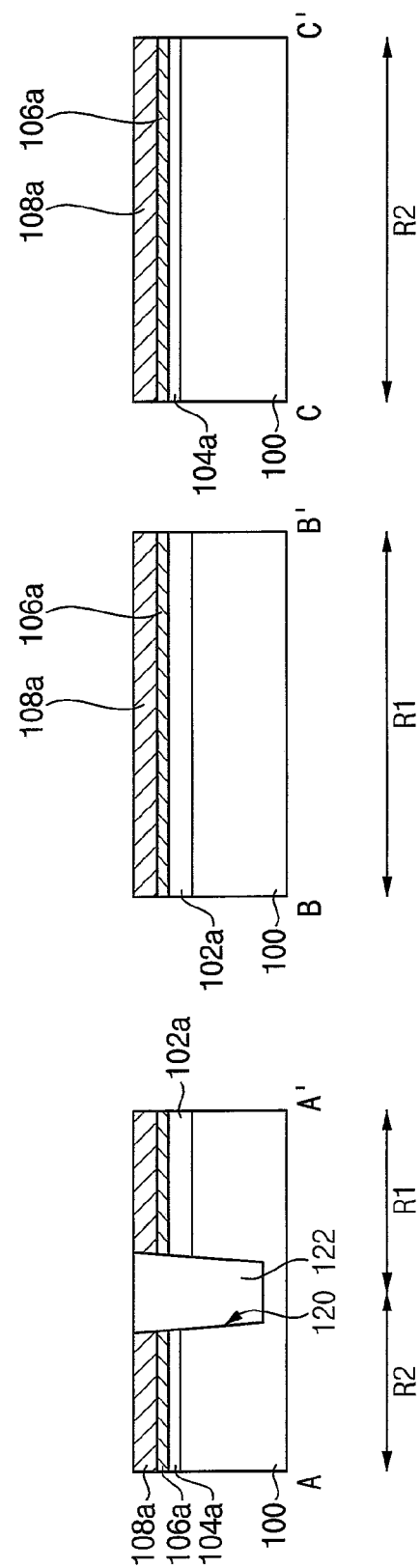

Referring to FIG. 10, in some embodiments, an insulation layer is formed on the first hard mask pattern 110a that fills the isolation trench 120. The insulation layer includes silicon oxide.

In some embodiments, the insulation layer and the first hard mask pattern 110a are planarized until an upper surface of the stopping layer pattern 108a is exposed. In the planarization process, the stopping layer pattern 108a serves as a polishing stop layer. The planarization process transforms the isolation insulation layer into a preliminary isolation layer pattern 122 that fills the isolation trench 120. Further, the first hard mask pattern 110a is removed by the planarization process. The planarization process includes a chemical mechanical polishing process. When the planarization process is performed, upper surfaces of the stopping layer pattern 108a and the preliminary isolation layer pattern 122 are coplanar with each other.

Figure 11:
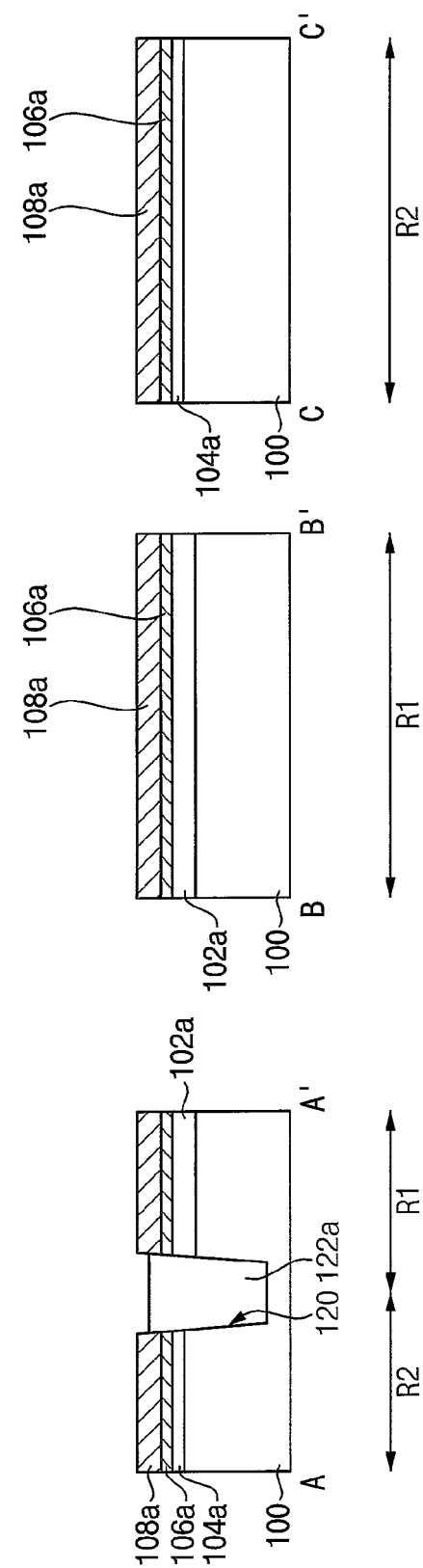

Referring to FIG. 11, in some embodiments, an upper portion of the preliminary isolation layer pattern 122 is partially removed to form an isolation layer pattern 122a. The removing process includes a wet etching process. Residues, such as a part of the first hard mask pattern 110a that remain on the stopping layer pattern 108a, are completely removed by the removing process. Further, an upper surface of the isolation layer pattern 122a is slightly lower than an upper surface of the stopping layer pattern 108a due to the wet etching process.

After performing the wet etching process, in some embodiments, if the upper surface of the isolation layer pattern 122a is lower than the upper surface of the preliminary first polysilicon pattern 106a, the isolation layer pattern 122a might not cover sidewalls of the first and second gate insulation layer patterns 102a and 104a. In this case, sidewalls of the first and second gate insulation layer patterns 102a and 104a are exposed, and thus damage car occur to the first and second gate insulation layer patterns 102a and 104a in subsequent processes. Thus, the upper surface of the isolation layer pattern 122a should be higher than the upper surface of the preliminary first polysilicon pattern 106a. In some embodiments, the upper surface of the isolation layer pattern 122a is coplanar with the upper surface of the preliminary first polysilicon pattern 106a.

In some embodiments, the stopping layer pattern 108a is formed on the preliminary first polysilicon pattern 106a. Thus, although the preliminary first polysilicon pattern 106a is very thin in a vertical direction, the wet etching process is controlled so that the sidewall of the preliminary first polysilicon pattern 106a is not exposed.

In some embodiments, the upper portion of the isolation layer pattern 122a is not removed.

Figure 12:
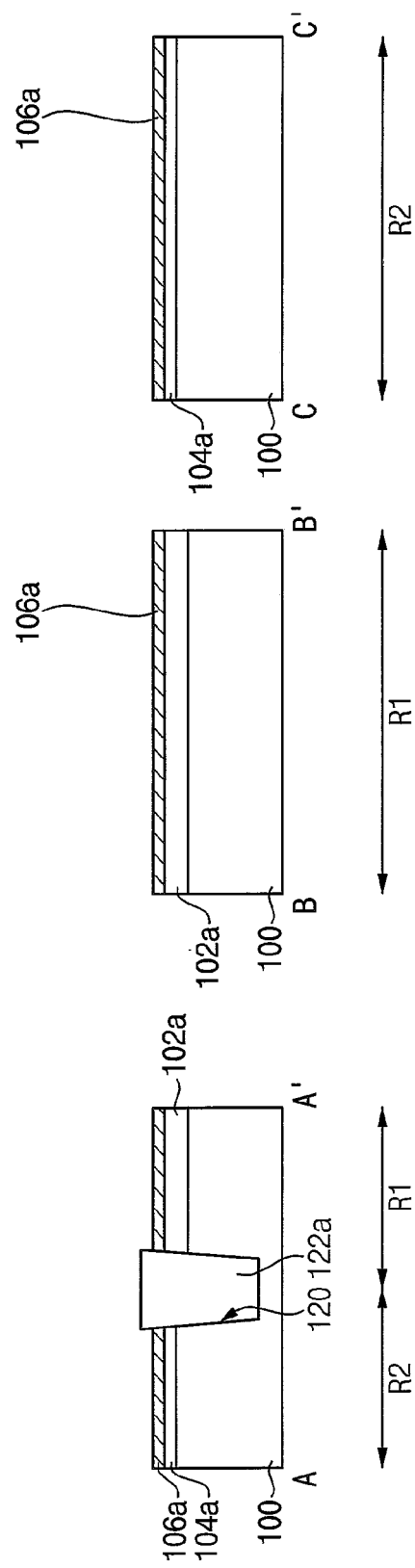

Referring to FIG. 12, in some embodiments, the stopping layer pattern 108a is removed to expose the upper surface of the preliminary first polysilicon pattern 106a. The removing process includes a wet etching process.

In some embodiments, the upper surface of the preliminary first polysilicon pattern 106a is lower than the upper surface of the isolation layer pattern 122a. Thus, the isolation layer pattern 122a protrudes from the preliminary first polysilicon pattern 106a in the vertical direction. An upper sidewall of the isolation layer pattern 122a is partially exposed.

As shown FIG. 12, in some embodiments, the preliminary first polysilicon pattern 106a and the first and second gate insulation layer patterns 102a and 104a are cut by the isolation trench 120. Sidewalls of the preliminary first polysilicon pattern 106a and the first gate insulation layer pattern 102a directly contact the upper sidewall of the isolation layer pattern 122a. Sidewalls of the preliminary first polysilicon pattern 106a and the second gate insulation layer pattern 104a directly contact the upper sidewall of the isolation layer pattern 122a.

Figure 13:
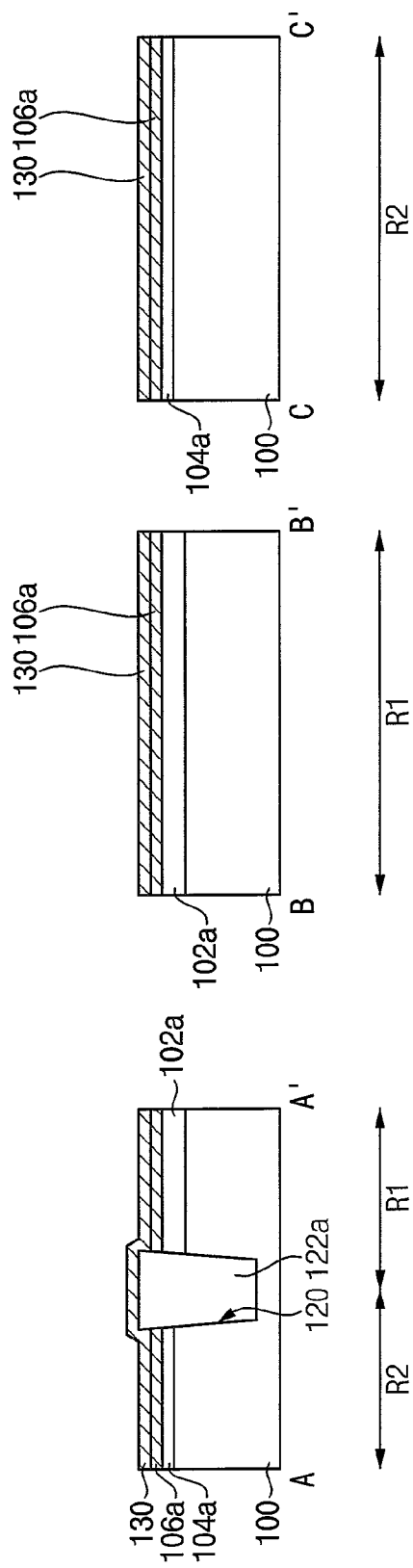

Referring to FIG. 13, in some embodiments, a second polysilicon layer 130 is conformally formed on the surfaces of the preliminary first polysilicon pattern 106a and the isolation layer pattern 122a. The second polysilicon layer 130 has a substantially uniform thickness.

Thus, in some embodiments, an upper surface of the second polysilicon layer 130 formed on the upper surface of the preliminary first polysilicon pattern 106a is lower than an upper surface of the second polysilicon layer 130 formed on the upper surface of the isolation layer pattern 122a. The second polysilicon layer 130 has a step difference at a boundary portion between the preliminary first polysilicon pattern 106a and the isolation layer pattern 122a. The second polysilicon layer 130 is in an amorphous state when a deposition process is performed.

In some embodiments, the second polysilicon layer 130 formed in the first region R1 is doped with impurities that control a threshold voltage. Further, the second polysilicon layer 130 formed in the second region R2 is also doped with impurities that control a threshold voltage. When the second polysilicon layer 130 is in an amorphous state, the impurities can be easily doped into the second polysilicon layer 130, and a doping depth of the impurities is easily adjusted, as compared to a polysilicon silicon layer in a crystalline state. Further, the impurities diffuse downward, and thus the impurities are doped into the preliminary first polysilicon pattern 106a. As subsequent processes are performed, the second polysilicon layer 130 is crystallized.

Figure 14:
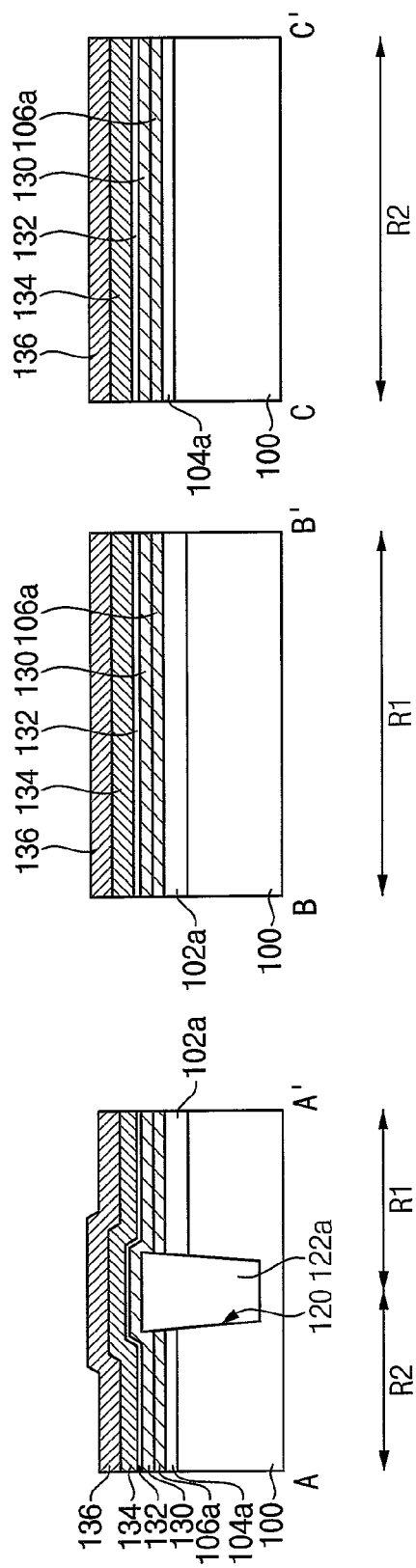

Referring to FIG. 14, in some embodiments, a barrier metal layer 132 and a metal layer 134 are conformally formed on the second polysilicon layer 130. A second hard mask layer 136 is conformally formed on the metal layer 134.

In some embodiments, an upper surface of a stacked structure of the barrier metal layer 132, the metal layer 134, and the second hard mask layer 136 formed on the preliminary first polysilicon pattern 106a is lower than an upper surface of the stacked structure of the barrier metal layer 132, the metal layer 134, and the second hard mask layer 136 formed on the isolation layer pattern 122a. Thus, the upper surface of the stacked structure of the barrier metal layer 132, the metal layer 134, and the second hard mask layer 136 has a step difference at a boundary portion between the preliminary first polysilicon pattern 106a and the isolation layer pattern 122a.

Figure 15:
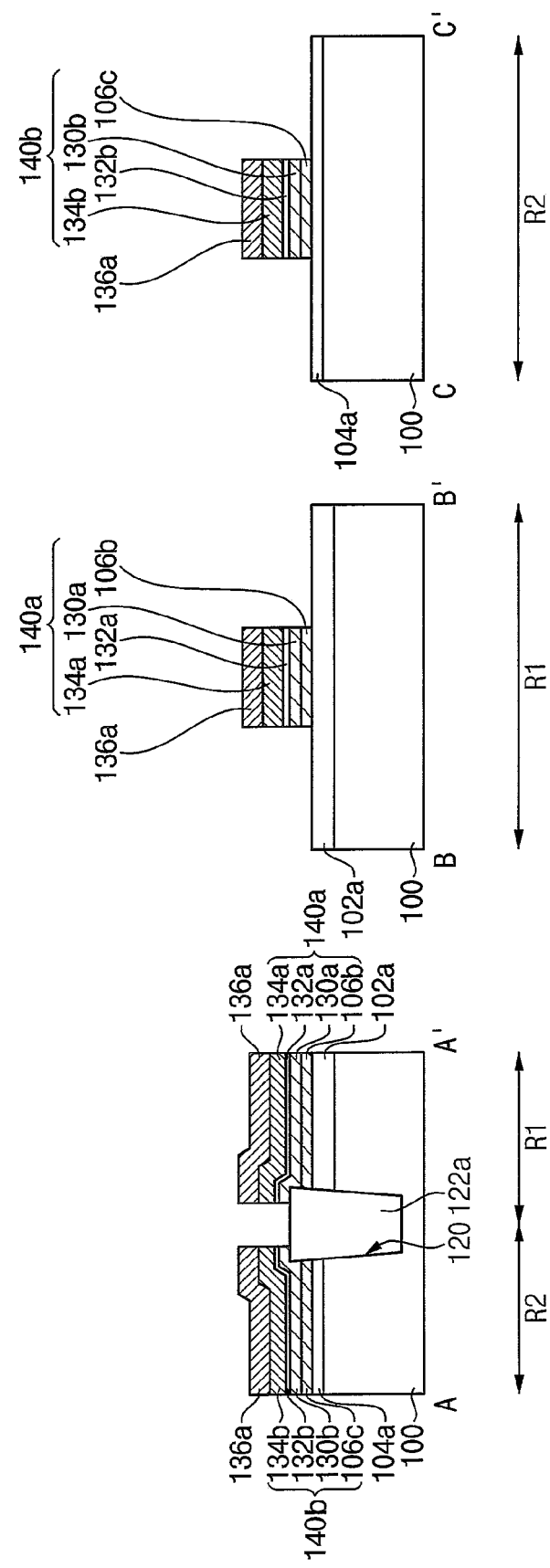

Referring to FIG. 15, in some embodiments, the second hard mask layer 136 is patterned by a photolithography process to form a second hard mask pattern 136a. The second hard mask pattern 136a serves as an etching mask for forming first and second gate electrode structures of the first and second transistors, respectively. Thus, the second hard mask pattern 136a is disposed to cross the first and second active regions.

In some embodiments, the metal layer 134, the barrier metal layer 132, the second polysilicon layer 130, and the preliminary first polysilicon pattern 106a are sequentially etched using the second hard mask pattern 136a as an etching mask to form a first gate electrode structure 140a and a second gate electrode structure 140b. The first gate electrode structure 140a is formed on the first gate insulation layer pattern 102a, and the first gate electrode structure 140a is a stacked structure that includes a first polysilicon pattern 106b, a second polysilicon pattern 130a, a first barrier metal pattern 132a, and a first metal pattern 134a. The second gate electrode structure 140b is formed on the second gate insulation layer pattern 104a, and the second gate electrode structure 140b is a stacked structure that includes a third polysilicon pattern 106c, a fourth polysilicon pattern 130b, a second barrier metal pattern 132b, and a second metal pattern 134b.

Therefore, in some embodiments, the first gate electrode structure 140a and the second hard mask pattern 136a are stacked on the first gate insulation layer pattern 102a in the first region R1, and the second gate electrode structure 140b and the second hard mask pattern 136a are stacked on the second gate insulation layer pattern 104a in the second region R2.

In some embodiments, the first gate electrode structure 140a and the second hard mask pattern 136a extend in the first direction, and the first gate electrode structure 140a and the second hard mask pattern 136a cross the first active region (see FIG. 1, 101a). End portions in the first direction of the first gate electrode structure 140a and the second hard mask patter 136a are disposed on the field region.

In some embodiments, the sidewall of the first polysilicon pattern 106b contacts the sidewall of the isolation layer pattern 122a. An upper surface of the first polysilicon pattern 106b is substantially flat. The upper surface of the first polysilicon pattern 106b is lower than the upper surface of the isolation layer pattern 122a. The second polysilicon pattern 130a is conformally formed on the upper surface of the first polysilicon pattern 106b and the upper sidewall and the upper surface of the isolation layer pattern 122a. End portions in the first direction of the second polysilicon pattern 130a are disposed on the field region. The first barrier metal pattern 132a and the first metal pattern 134a are disposed on the second polysilicon pattern 130a, and end portions in the first direction of the first barrier metal pattern 132a and the first metal pattern 134a are disposed on the isolation layer pattern 122a.

In some embodiments, the second gate electrode structure 140b and the second hard mask pattern 136a extend in the first direction, and the second gate electrode structure 140b and the second hard mask pattern 136a cross the second active region (see FIG. 1, 101b). End portions in the first direction of the second gate electrode structure 140b and the second hard mask pattern 136a are disposed on the field region. A stacked structure and a shape of the second gate electrode structure 140b is substantially the same as a stacked structure and a shape of the first gate electrode structure 140a, respectively.

Figure 16:
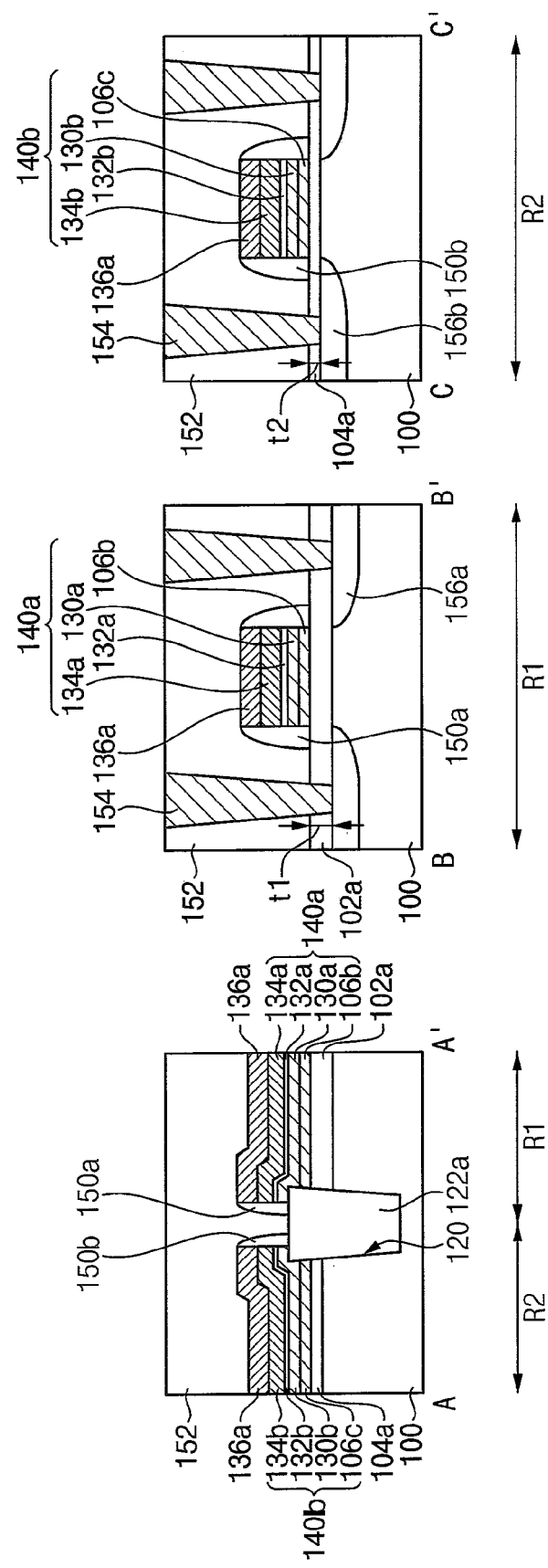

Referring to FIG. 16, in some embodiments, a first spacer 150a is formed on sidewalk of a first structure that includes the stacked first gate electrode structure 140a and the second hard mask pattern 136a. A second spacer 150b is formed on sidewalk of a second structure that includes the stacked second gate electrode structure 140b and the second hard mask pattern 136a.

In some embodiments, impurities are doped into the first and second active regions adjacent to both sides of the first and second gate electrode structures 140a and 140b to form first and second impurity regions 156a and 156b that serve as sources/drain regions.

In some embodiments, a first insulating interlayer 152 is formed on the first gate insulation layer pattern 102a, the second gate insulation layer pattern 104a, and the isolation layer pattern 122a to cover the first structure and the second structure.

In some embodiments, contact plugs 154 are formed that penetrate the first insulating interlayer 152, and the contact plugs 154 contact the first and second impurity regions 156a and 156b, respectively.

As described above, in some embodiments, the first and second transistors are formed.

As the vertical thicknesses of the first and third polysilicon patterns 106b and 106c decrease, parasitic capacitances in the first and second transistors decreases.

Figure 17:
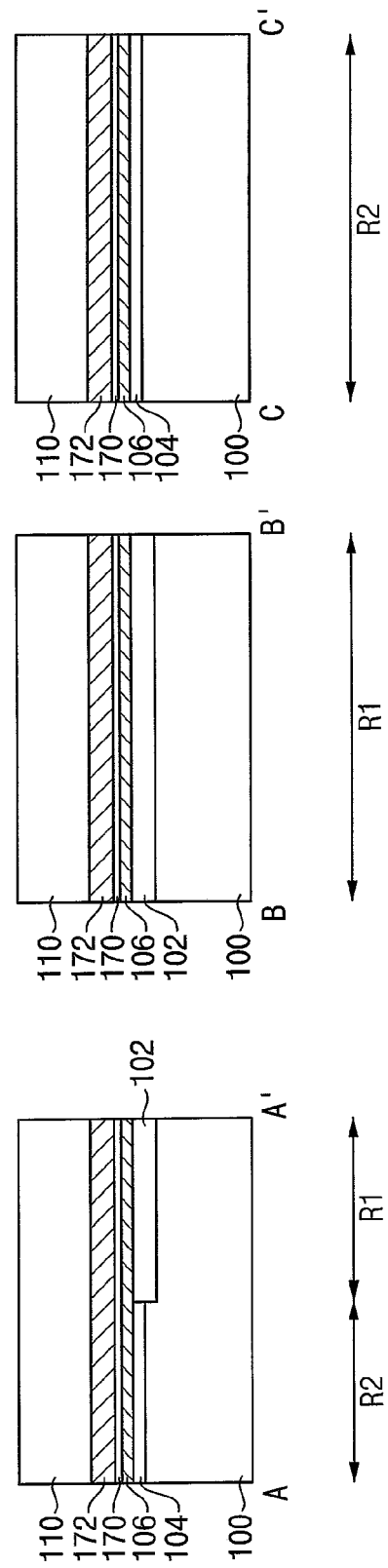
FIGS. 17 to 19 are cross-sectional views that illustrate a method of manufacturing a semiconductor device in accordance with embodiments.
Figure 18:
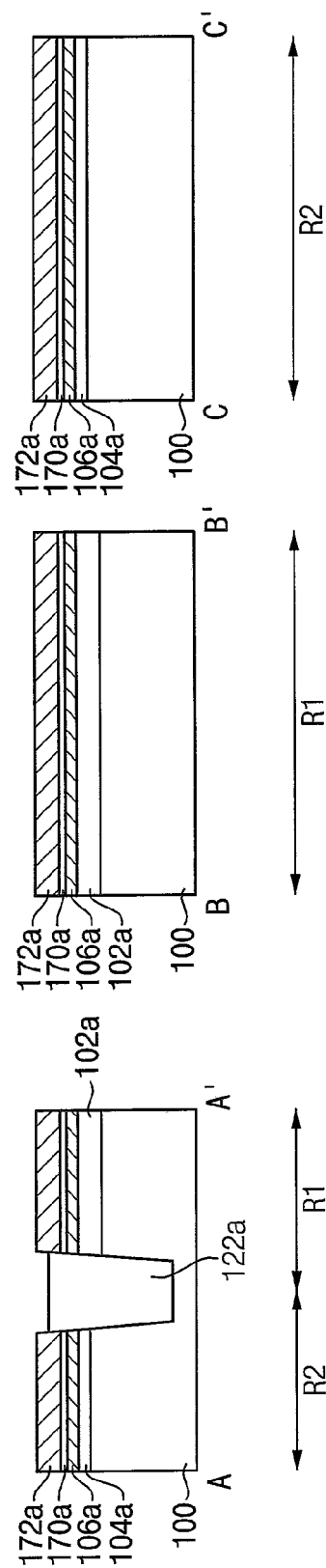
Figure 19:
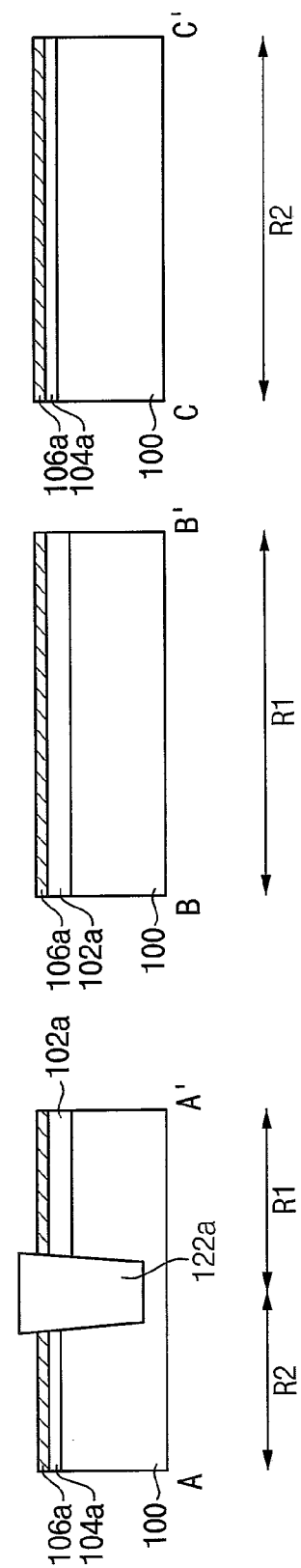

FIGS. 17 to 19 are cross-sectional views that illustrate a method of manufacturing a semiconductor device in accordance with embodiments.

FIGS. 17 to 19 include cross-sectional views taken along the lines A-A', B-B' and C-C' of FIG. 1.

A method of manufacturing a semiconductor device described below includes substantially the same processes as those described with reference to FIGS. 5 to 16. However, a process of forming a stopping layer is different.

Referring to FIG. 17, in some embodiments, first, processes substantially the same as or similar to those illustrated with reference to FIGS. 5 to 7 are performed. Thereafter, first and second stopping layers 170 and 172 are formed on the first polysilicon layer 106.

In some embodiments, the first stopping layer 170 includes a material that has a high etching selectivity with respect to the lower first polysilicon layer 106. Further, the second stopping layer 172 includes a material that is used as a polishing stop layer in a subsequent planarization process of silicon oxide. In embodiments, the first stopping layer 170 includes, e.g., silicon oxide, and the second stopping, layer 172 includes, e.g., polysilicon. A stacked structure that includes the first stopping layer 170 and the second stopping layer 172 serves as a stopping layer structure.

In some embodiments, a first hard mask layer 110 is former on the second stopping layer 172. The first hard mask layer 110 includes, e.g., silicon oxide.

Referring to FIG. 18, in some embodiments, processes substantially the same as or similar to those illustrated with reference to FIGS. 9 to 11 are performed to form the isolation layer pattern 122a. The upper surface of the isolation layer pattern 122a is higher than a lower surface of the second stopping layer pattern 172a in the stopping layer structure.

Referring to FIG. 19, in some embodiments, the second stopping layer pattern 172a is etched, and the first stopping layer pattern 170a is subsequently etched to expose an upper surface of the preliminary first polysilicon pattern 106a.

Thereafter, in some embodiments, processes substantially the same as or similar to those illustrated with reference to FIGS. 13 to 16 are performed to form the first and second transistors shown in FIG. 16.

Figure 20:
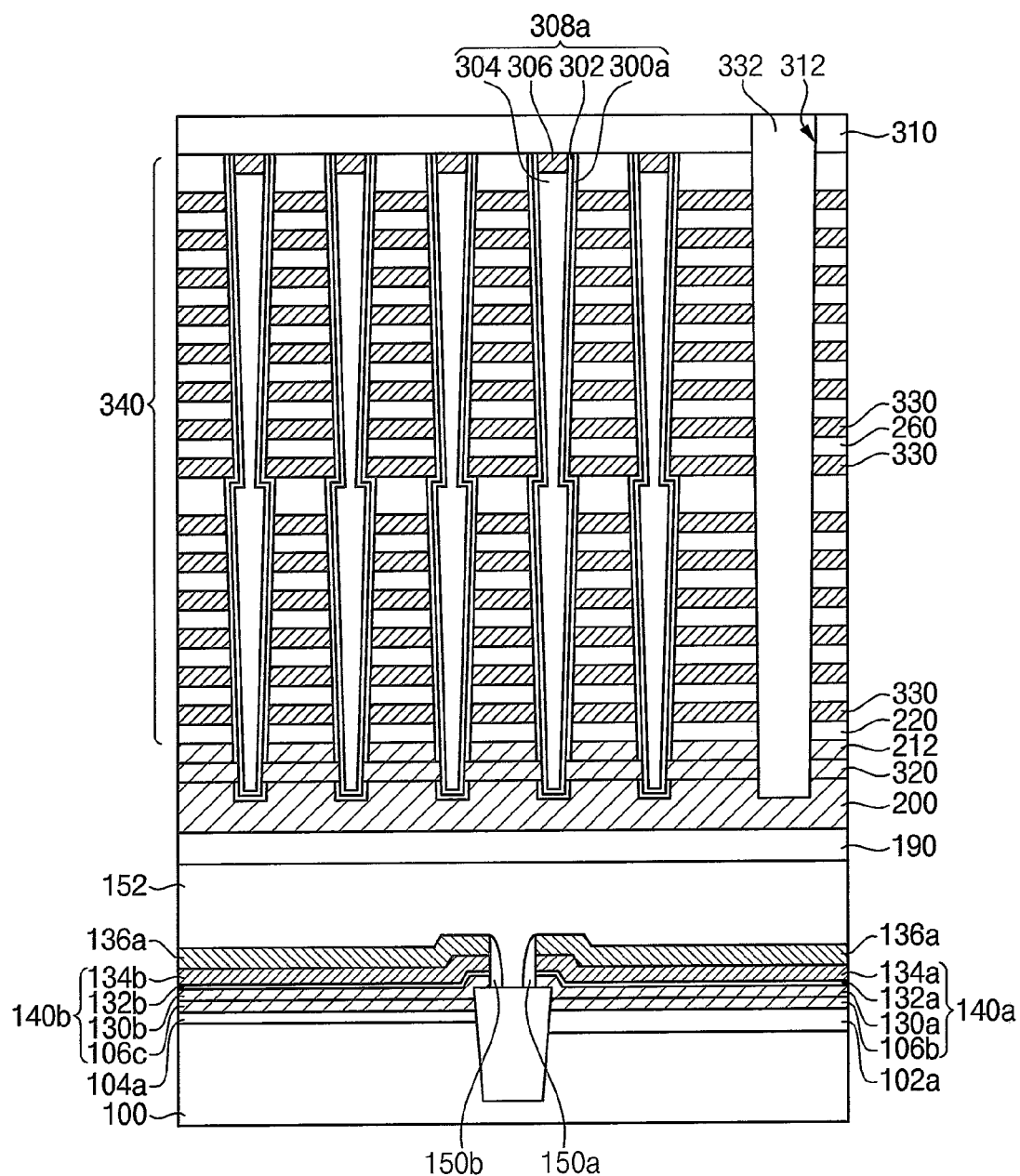
FIG. 20 is a cross-sectional view of a vertical memory device in accordance with embodiments.

FIG. 20 is a cross-sectional view of a vertical memory device in accordance with embodiments.

In some embodiments, the vertical semiconductor device is a NAND flash memory device.

Referring to FIG. 20, in some embodiments, the vertical semiconductor device has a cell on peripheral (COP) structure in which peripheral circuits are formed on a substrate and stacked memory cells are formed over the peripheral circuits.

In some embodiments, first transistors, second transistors, a first insulating interlayer 152 and contact plugs that constitute the peripheral circuits are formed on the substrate 100. The first transistors are high voltage transistors that operate at a high voltage, and the second transistors are low voltage transistors that operate at a low voltage. The first transistors, the second transistors, the first insulating interlayer 152 and the contact plug on the substrate 100 are substantially the same as the first transistors, the second transistors, insulating interlayer and, the contact plug illustrated with reference to FIGS. 1 and 2, respectively.

In some embodiments, lower wirings that are electrically connected to the first transistors and the second transistors are further formed on the substrate 100. A second insulating interlayer 190 is further formed on the first insulating interlayer 152;

In some embodiments, memory cells are formed over the first and second transistors. For example, the memory cells are formed on the second insulating interlayer 190.

Hereinbelow, an example of the memory cells is described. However, embodiments of a structure of the memory cells are not limited thereto.

In some embodiments, a base semiconductor pattern 200 is formed on the second insulating interlayer 190. The base semiconductor pattern 200 includes polysilicon.

In some embodiments, a channel connection pattern 320 and a support layer 212 are formed on the base semiconductor pattern 200. A cell stacked structure 340 is formed on the support layer 212.

In some embodiments, the cell stacked structure 340 includes insulation layers 220 and 260 and gate patterns 330 that are alternately and repeatedly stacked. The cell stacked structure extends in the first direction. In some embodiments, the plurality of cell stacked structures 340 are spaced apart from each other in the second direction. That is, a first trench 312 that extends in the first direction is disposed between the cell stacked structures 340. A separation pattern 332 fills the first trench 312.

In some embodiments, channel holes pass through the cell stacked structure 340 and expose an upper surface of the base semiconductor pattern 200. A channel structure 308a is formed in each of the channel holes.

In some embodiments, the channel structure 308a includes a charge storage structure 300a, a channel 302, a filling insulation pattern 304, and a capping pattern 306.

In some embodiments, the charge storage structure 300a contacts a sidewall of the channel hole. The charge storage structure 300a includes a first blocking layer, a charge storage layer, and a tunnel insulation layer that are sequentially stacked on the sidewall of the channel hole. The channel 302 contacts the tunnel insulation layer, and the channel 302 is electrically connected to the base semiconductor pattern 200.

In some embodiments, the sidewall of the channel 302 contacts the channel connection pattern 320. That is, a lower sidewall of the channel 302 that faces the channel connection pattern 320 contacts the channel connection pattern 320. Thus, the tunnel insulation layer, the charge storage layer, and the first blocking layer on the lower sidewall of the channel 302 that faces the channel connection pattern 320 are partially removed. The filling insulation pattern 304 is formed on the channel 302 to fill the channel hole. The capping pattern 306 is formed on the filling insulation pattern 304 in the channel hole. The channel 302 is electrically connected to the base semiconductor pattern 200 by the channel connection pattern 320.

In some embodiments, a first upper insulating interlayer 310 is formed to cover the cell stacked structure 340 and the channel structure 308a. The first upper insulating interlayer 310 includes silicon oxide. The first trench 312 extends in the vertical direction from the first upper insulating interlayer 310 to an upper portion of the channel connection pattern 320.

In some embodiments, cell contact plugs are further formed on upper surfaces of the gate patterns 330 in the cell stacked structure. A second upper insulating interlayer is further formed on the first upper insulating interlayer 310. Through via contacts extend from the upper second insulating interlayer to the lower wiring in the vertical direction.

As described above, in some embodiments, in a NAND flash memory device, the first and second transistors that configure the peripheral circuits have excellent electrical characteristics. Therefore, the NAND flash memory device has excellent electrical characteristics.

In some embodiments, when a NAND flash memory device is manufactured, the peripheral circuits that include the first and second transistors are formed on the substrate, and the insulating interlayer is formed to cover the first and second transistors. In addition, the memory cells are formed on the insulating interlayer. The first and second transistors are formed by a same process as that described with reference to FIGS. 5 to 16, or a same process as that described with reference to FIGS. 17 to 19.

As such, in some embodiments, a process that forms the first and second transistors of the peripheral circuit and a process that forms the memory cells are separate processes. Therefore, the first and second transistors are formed by an optimized process without consideration of the process that forms the memory cells.

Figure 21:
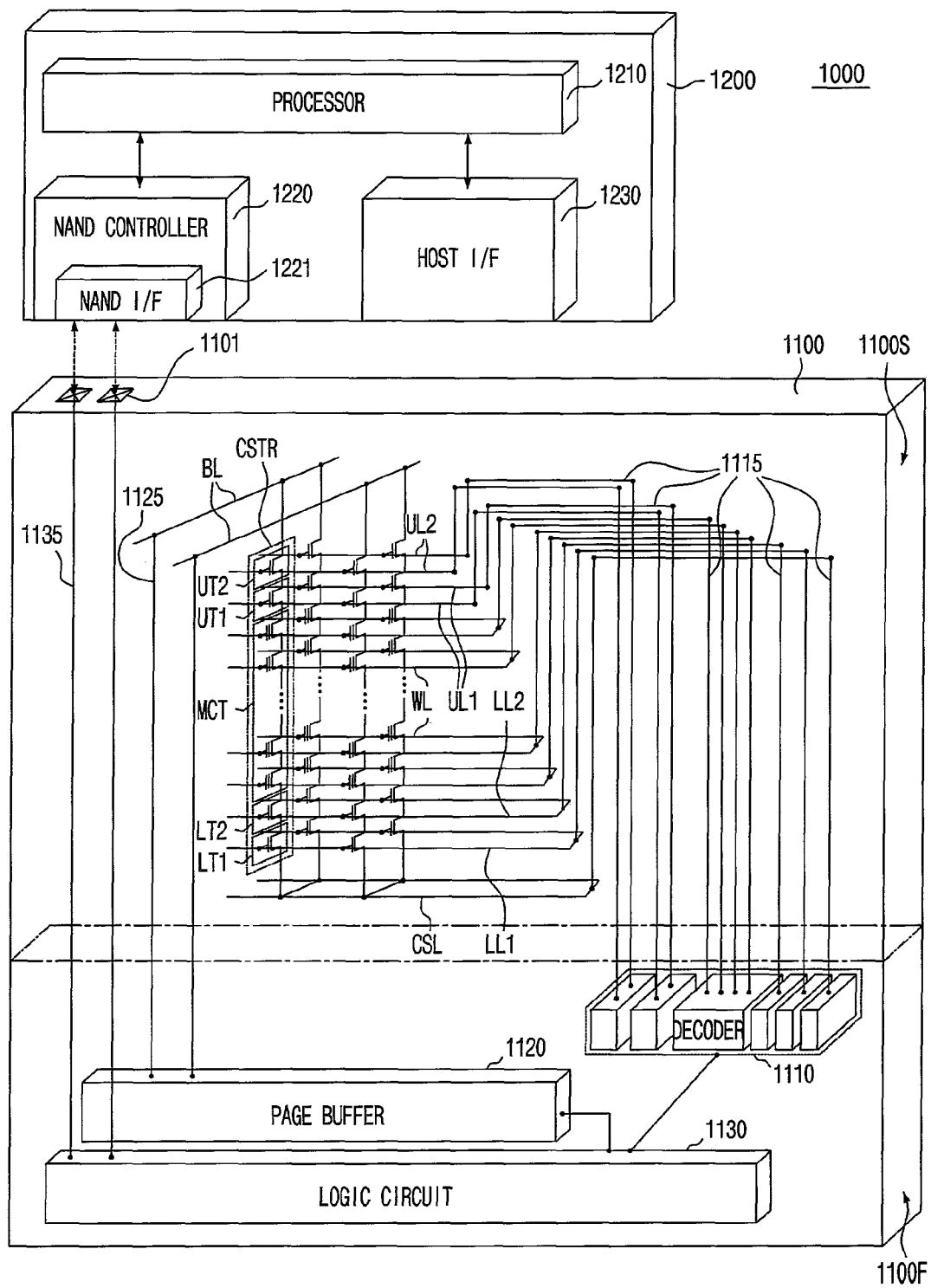
FIG. 21 is a schematic diagram of an electronic system that includes a semiconductor device in accordance with embodiments.

FIG. 21 is a schematic diagram of an electronic system including a semiconductor device in accordance with embodiments.

Referring to FIG. 21, an electronic system 1000 in accordance with some embodiments includes a semiconductor device 1100 and a controller 1200 that is electrically connected to the semiconductor device 1100. The electronic system 1000 may be a storage device that includes one or more semiconductor devices 1100 or an electronic device that includes a storage device. For example, the electronic system 1000 may be a solid state drive device (SSD), a universal serial bus (USB), a computing system, a medical device, or a communication device, which include one or more semiconductor devices 1100.

In some embodiments, the semiconductor device 1100 is a non-volatile memory device. For example, the semiconductor device 1100 is a NAND flash memory device that has a COP structure that is illustrated with reference to FIG. 20.

In some embodiments, the semiconductor device 1100 includes a first structure 1100F and a second structure 1100S on the first structure 1100F. In some embodiments, the first structure 1100F is beside the second structure 1100S. The first structure 1100F is a peripheral circuit structure that includes a decoder circuit 1110, a page buffer 1120, and a logic circuit 1130. The second structure 1100S includes bit lines BL, a common source line CSL word lines WL, first and second gate upper lines UL1 and UL2, and first and second gate lower lines LL1 and LL2, and memory cell strings CSTR between the bit lines BL and the common source lute CSL. The second structure 1100S is a memory cell structure.

In some embodiments, in the second structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The umber of lower transistors LT1 and LT2 and the number of upper transistors UT1 and UT2 may vary in different embodiments.

In some embodiments, the upper transistors UT1 and UT2 include a string selection transistor, and the lower transistors LT1 and LT2 include a ground selection transistor. Gate lower lines LL1 and LL2 are gate electrodes of the lower transistors LT1 and LT2, respectively. The word lines WL are gate electrodes of the memory cell transistors MCT, and the gate upper lines UL1 and UL2 are gate electrodes of the upper transistors UT1 and UT2, respectively.

In some embodiments, the lower transistors LT1 and LT2 include a lower erase control transistor LT1 and a ground selection transistor LT2 that are connected in series. The upper transistors UT1 and UT2 include a string select transistor UT1 and an upper erase control transistor UT2 that are connected in series. At least one of the lower erase control transistor LT1 and the upper erase control transistor UT1 is used to be erase data stored in the memory cell transistors MCT, and the data is erased by using a gate induced leakage current (GIDL).

In some embodiments, the common source line CSL, the first and second gate lower lines LL1 and LL2, the word lines WL, and the first and second gate upper lines UL1 and UL2 are electrically connected to the decoder circuit 1110 by a first connection wiring 1115 that extends from the first structure 110F to the second structure 1100S. The bit lines BL are electrically connected to the page buffer 1120 by a second connection wiring 1125 that extends from the first structure 110F to the second structure 1100S.

In some embodiments, in the first structure 110F, the decoder circuit 1110 and the page buffer 1120 control at least one selected memory cell transistor of the plurality of memory cell transistors MCT. The decoder circuit 1110 and the page buffer 1120 are controlled by the logic circuit 1130. The semiconductor device 1100 is communicates with the controller 1200 through an input/output pad 1101 that is electrically connected to the logic circuit 1130. The input/output pad 1101 is electrically connected to the logic circuit 1130 by an input/output connection wiring 1135 that extends from the first structure 110F to the second structure 1100S.

In some embodiments, the controller 1200 includes a processor 1210, a NAND controller 1220, and a host interface 1230. In embodiments, the electronic system 1000 includes a plurality of semiconductor devices 1100. In this case, the controller 1200 controls the plurality of semiconductor devices 1100.

In some embodiments, the processor 1210 controls an overall operation of the electronic system 1000, including the controller 1200. The processor 1210 operates according to a firmware. The processor 1210 controls the NAND controller 1220 so that the semiconductor device 1100 can be accessed. The NAND controller 1220 includes a NAND interface 1221 that communicates with the semiconductor device 1100. A control command that controls the semiconductor device 1100, data for writing to the memory cell transistors MCT of the semiconductor device 1100, and data for reading from the memory cell transistors MCT of the semiconductor device 1100 are transmitted by the NAND interface 1221. The electronic system 1000 communicates with an external host through the host interface. When a control command is received from an external host by the host interface 1230, the processor 1210 controls the semiconductor device 1100 in response to the control command.

Figure 22:
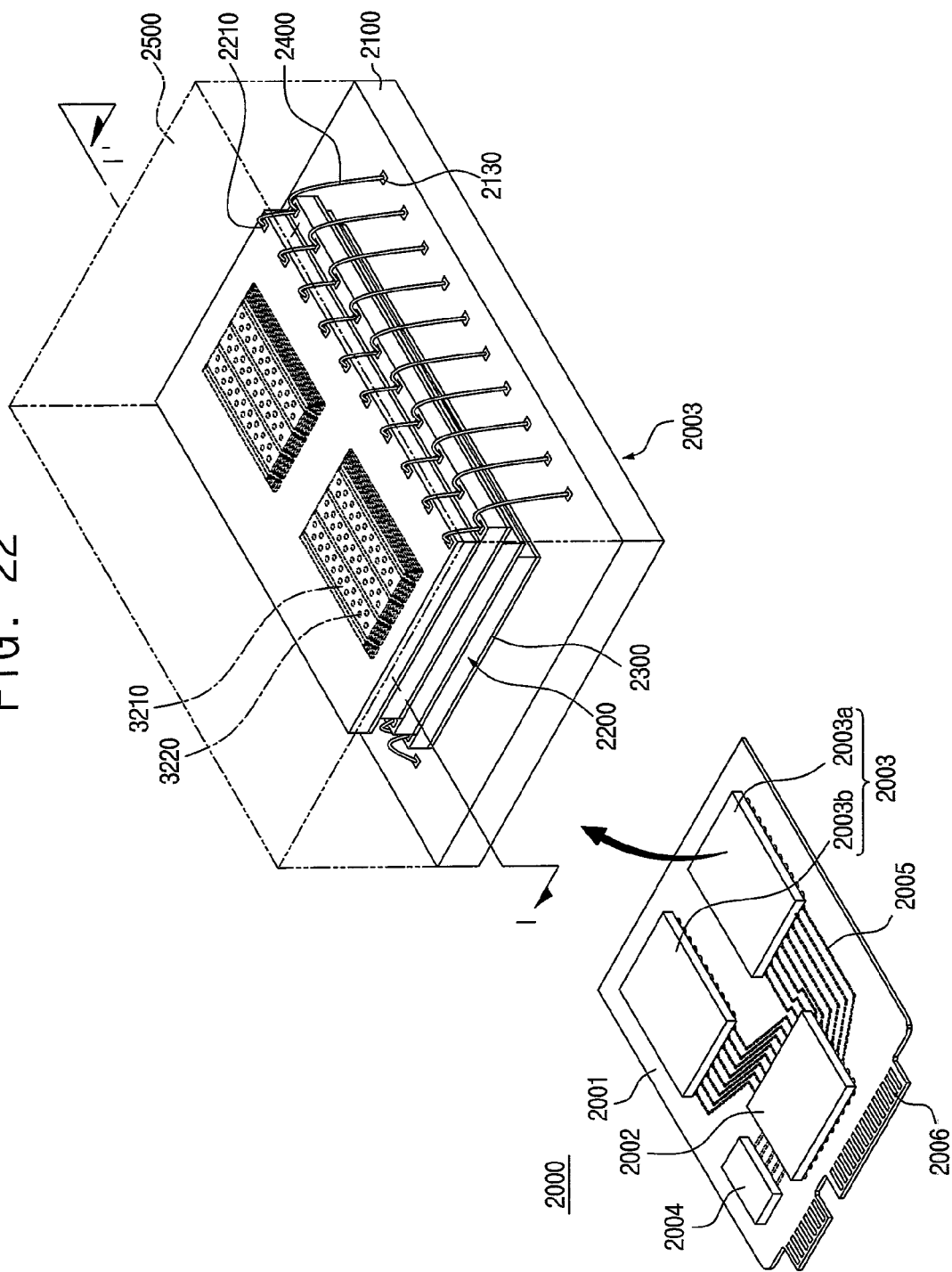
FIG. 22 is a schematic perspective view of an electronic system that includes a semiconductor device accordance with embodiments.

FIG. 22 is a schematic perspective view of an electronic system that includes a semiconductor device in accordance with embodiments.

Referring to FIG. 22, an electronic system 2000 in accordance with some embodiments includes a main substrate 2001, a controller 2002 mounted on the main substrate 2001, one or more semiconductor packages 2003, and a DRAM 2004. The semiconductor package 2003 and the DRAM 2004 are connected to the controller 2002 by wiring patterns 2005 formed on the main substrate 2001.

In some embodiments, the strain substrate 2001 includes a connector 2006 that includes a plurality of pins coupled to an external host. The number and arrangement of the plurality of pins in the connector 2006 is determined according to a communication interface between the electronic system 2000 and the external host. In some embodiments, the electronic system 2000 communicates with the external host through the communication interface, and the communication interface is one of a Universal Serial Bus (USB), a Peripheral Component Interconnect Express (PCI-Express), a Serial Advanced Technology Attachment (SATA), or an M-Phy for Universal Flash Storage (UFS), etc. In embodiments, the electronic system 2000 is operated by power received from the external host through the connector 2006. The electronic system 2000 further includes a Power Management integrated Circuit (PMIC) that distributes the power received from the external host to the controller 2002 and the semiconductor package 2003.

In some embodiments, the controller 2002 writes data to the semiconductor package 2003, or the controller 2002 reads data from the semiconductor package 2003. The controller can increase an operation speed of the electronic system 2000.

In some embodiments, the DRAM 2004 is a buffer memory that reduces a difference between a speed of the semiconductor package 2003 and a speed of the external host. The DRAM 2004 in the electronic system 2000 also operates as a cache memory, and the DRAM 2004 provides a space for temporarily storing data in a control operation of the semiconductor package 2003. When the DRAM 2004 is included in the electronic system 2000, the controller 2002 includes a DRAM controller that controls the DRAM 2004 and a NAND controller that controls the semiconductor package 2003.

In some embodiments, the semiconductor package 2003 includes first and second semiconductor packages 2003a and 2003b spaced apart from each other. Each of the first and second semiconductor packages 2003a and 2003b includes a plurality of semiconductor chips 2200. Each of the first and second semiconductor packages 2003a and 2003b includes a package substrate 2100, the semiconductor chips 2200 on the package substrate 2100, adhesion layers 2300 disposed on a lower surface of each of the semiconductor chips 2200, a connection structure 2400 electrically connected to the semiconductor chips 2200 and the package substrate 2100, and a molding layer 2500 that covers the semiconductor chips 2200 and the connection structure 2400 on the package substrate 2100.

In some embodiments, the package substrate 2100 is a printed circuit board that includes package upper pads 2130. Each of the semiconductor chips 2200 includes an input/output pad 2210. The input/output pad 2210 corresponds to the input/output pad 1101 of FIG. 21. Each of the semiconductor chips 2200 includes cell stacked structures 3210 and channel structures 3220. Each of the semiconductor chips 2200 includes, e.g., a NAND flash memory device that has a COP structure illustrated with reference to FIG. 20.

In some embodiments, the connection structure 2400 is a bonding wire that electrically connects the input/output pad 2210 to the package upper pads 2130. Thus, in each of the first and second semiconductor packages 2003a and 2003b, the semiconductor chips 2200 are electrically connected to each other by the bonding wire. The semiconductor chips 2200 are electrically connected to the package upper pads 2130 on the package substrate 2100. In some embodiments, in each of the first and second semiconductor packages 2003a and 2003b, the semiconductor chips 2200 are electrically connected to each other by connection structures that include through silicon vias (TSV) instead of the bonding wiring.

In some embodiments, the controller 2002 and the semiconductor chips 2200 are included in one package. In some embodiments, the controller 2002 and the semiconductor chips 2200 are mounted on a separate interposer substrate that differs from the main substrate 2001, and the controller 2002 and the semiconductor chips 2220 are connected to each other by wirings formed on the interposer substrate.

Figure 23:
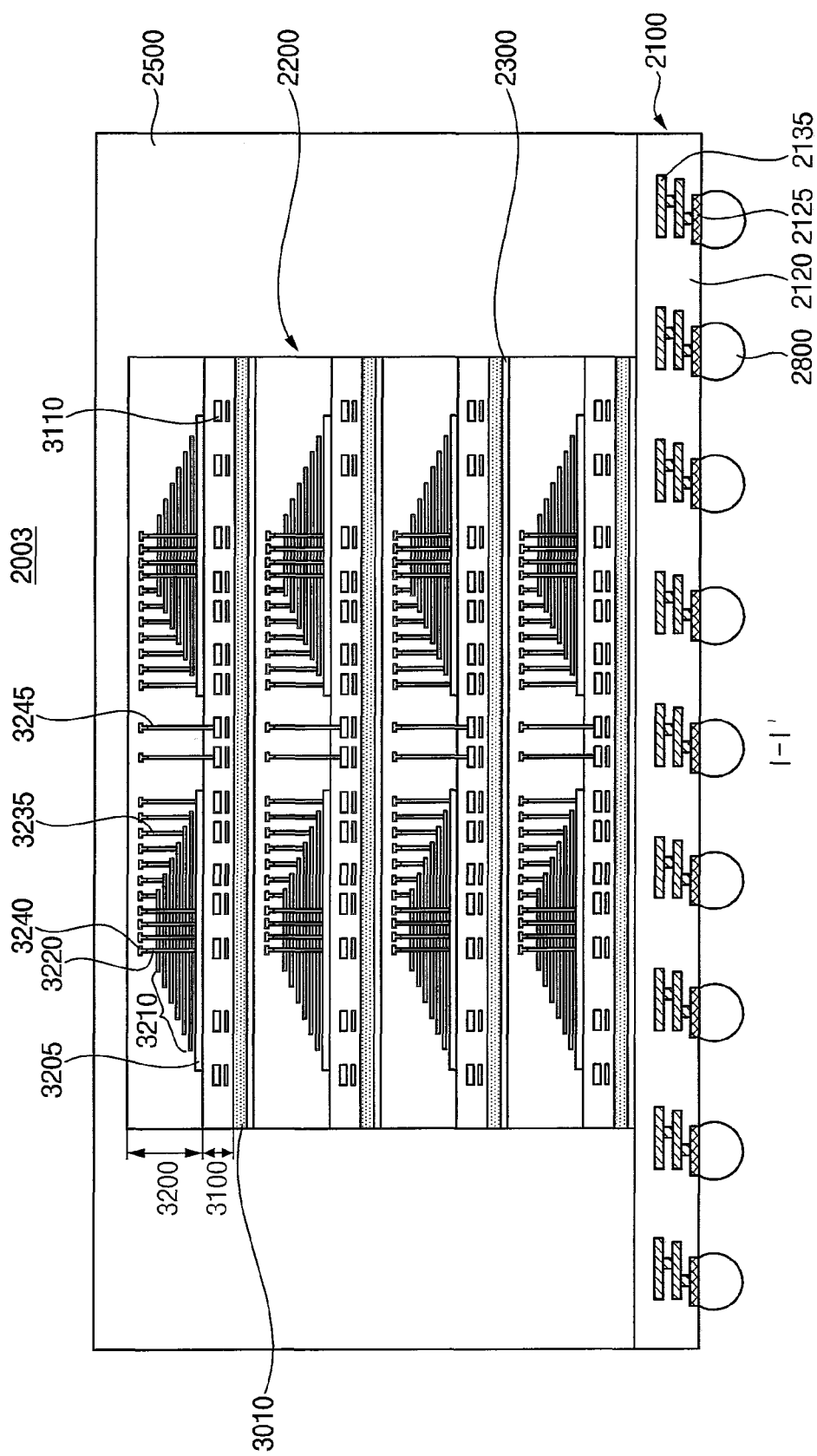
FIGS. 23 and 24 are cross-sectional views that schematically illustrate semiconductor packages in accordance with embodiments.
Figure 24:
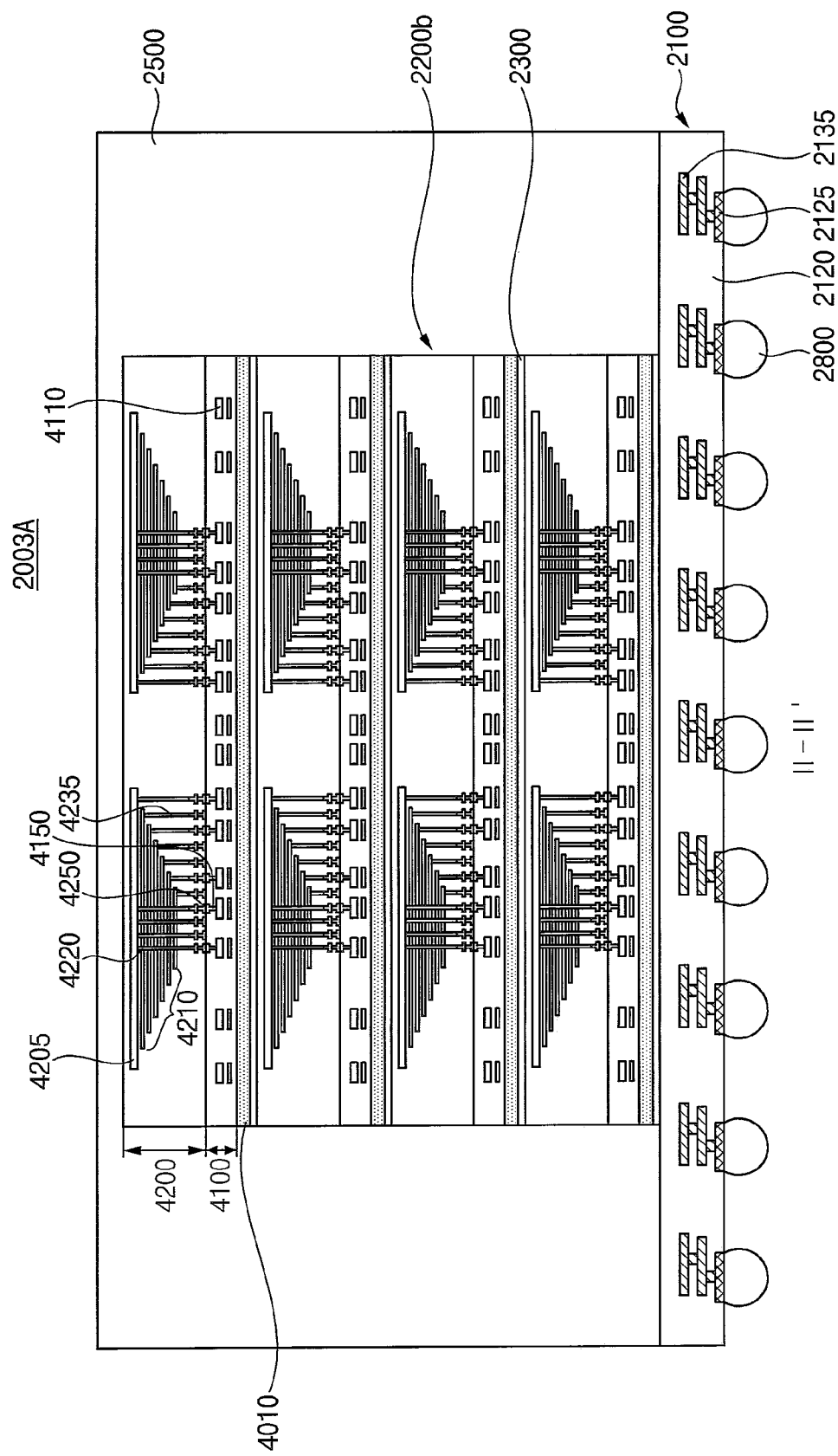

FIGS. 23 and 24 are cross-sectional views that schematically illustrate semiconductor packages in accordance with embodiments. Each of FIGS. 23 and 24 illustrates an embodiment of the semiconductor package 2003 in FIG. 22. Each of FIGS. 23 and 24 conceptually shows a portion cut along a cut line of I-I' of the semiconductor package 2003 in FIG. 22.

Referring to FIG. 23, in some embodiments, the package substrate 2100 of the semiconductor package 2003 is a printed circuit board. The package substrate 2100 includes a package substrate body part 2120, package upper pads (see FIG. 22, 2130) disposed on an upper surface of the package substrate body part 2120, lower pads 2125 disposed at a lower surface of the package substrate body part 2120 or exposed through the lower surface of the package substrate body part 2120, and internal wirings 2135 that electrically connect the package upper pads 2130 to the lower pads 2125 in an inner portion of the package substrate body part 2120. The package upper pads 2130 are electrically connected to connection structures 2400 shown in FIG. 22. The lower pads 2125 are connected to wiring patterns 2005 of the main substrate 2001 in the electronic system 2000 as shown in FIG. 22 through conductive connection parts 2800.

In some embodiments, each of the semiconductor chips 2200 includes a semiconductor substrate 3010 and a first structure 3100 and a second structure 3200 sequentially stacked on the semiconductor substrate 3010. The first structure 3100 includes a peripheral circuit region that includes peripheral wirings 3110. The second structure 3200 includes a common source line 3205, a cell stacked structure 3210 on the common source line 3205, channel structures 3220 and separation structures that pass through the cell stacked structure 3210, bit lines 3240 electrically connected to the channel structures 3220, gate connection wirings 3235 electrically connected to the word lines (see FIG. 21, WL) in the cell stacked structure 3210, and through via contacts 3245 between adjacent cell stacked structures 3210.

In some embodiments, each of the semiconductor chips 2200 includes, e.g., a NAND flash memory device that has a COP structure described with reference to FIG. 20. Further, the first structure 3100 in the semiconductor chip includes the first and second transistors described with reference to FIGS. 1 and 2.

In some embodiments, each of the semiconductor chips 2200 further includes the input/output pad 2210 that is electrically connected to the peripheral wirings 3110 of the first structure 3100, and each of the semiconductor chips 2200 extends to an inner portion of the second structure 3200. Further, some of the through via contacts 3245 are disposed beside the cell stacked structure. Some of the through via contacts 3245 pass through the cell stacked structure. Each of the semiconductor chips 2200 further includes the input/output pad 2210 that are electrically connected to the peripheral wirings 3110 of the first structure 3100.

Referring to FIG. 24, in some embodiments, in the semiconductor package 2003A, each of the semiconductor chips 2200a includes a semiconductor substrate 4010, a first structure 4100 on the semiconductor substrate 4010, and a second structure 4200 bonded onto the first structure 4100. The second structure 4200 is bonded onto the first structure 4100 by a wafer bonding process.

In some embodiments, the first structure 4100 includes a peripheral circuit region in which a peripheral wiring 4110 and first bonding structures 4150 are formed. The first structure 4100 includes the first and second transistors described with reference to FIGS. 1 and 2.

In some embodiments, the second structure 4200 includes a common source line 4205, a cell stacked structure 4210 between the common source line 4205 and the first structure 4100, channel structures 4220 and a separation structure that passthrough the cell stacked structure 4210, and second bonding structures 4250 electrically connected to the word lines (see FIG. 21, WL) of the cell stacked structure 4210 and the channel structures 4220. For example, in the second bonding structures 4250, the channel structures 4220 and the word lines (see FIG. 21, WL) and the gate are electrically connected to each other by connection wirings 4235 that connect the word lines (see FIG. 21, WL) and the gate of upper and lower transistors of the cell stacked structure 4210.

In some embodiments, each of the semiconductor chips 2200 includes a through via contact that is electrically connected to the peripheral wirings 4110 in the first structure 4100 and that extends into the second structure 4200.

In some embodiments, the through via contact pass through a dummy structure, and the through via contact is electrically connected to the peripheral wirings 4110 in the first structure 4100. Some of the through via contacts pass through the cell stacked structure 4210.

In some embodiments, the first bonding structures 4150 of the first structure 4100 and the second bonding structures 4250 of the second structure 4200 are bonded to each other. A contacting portion between the first bonding structure 4150 and the second bonding structure 4250 is formed of, e.g., copper (Cu).

In some embodiments, each of the semiconductor chips 2200a further includes the input/output pad (see FIG. 22, 2210) electrically connected to the peripheral wirings 4110 of the first structure 4100.

In some embodiments, the semiconductor chips 2200 shown in FIG. 23 and the semiconductor chips 2200a shown in FIG. 24 can be electrically connected to each other by the wire bonding type connection structures 2400. In some embodiments, semiconductor chips in one semiconductor package, such as the semiconductor chips 2200 shown in FIG. 23 and the semiconductor chips 2200a shown in FIG. 24, are electrically connected to each other by through silicon via connection structures 2400.

Figure 25:
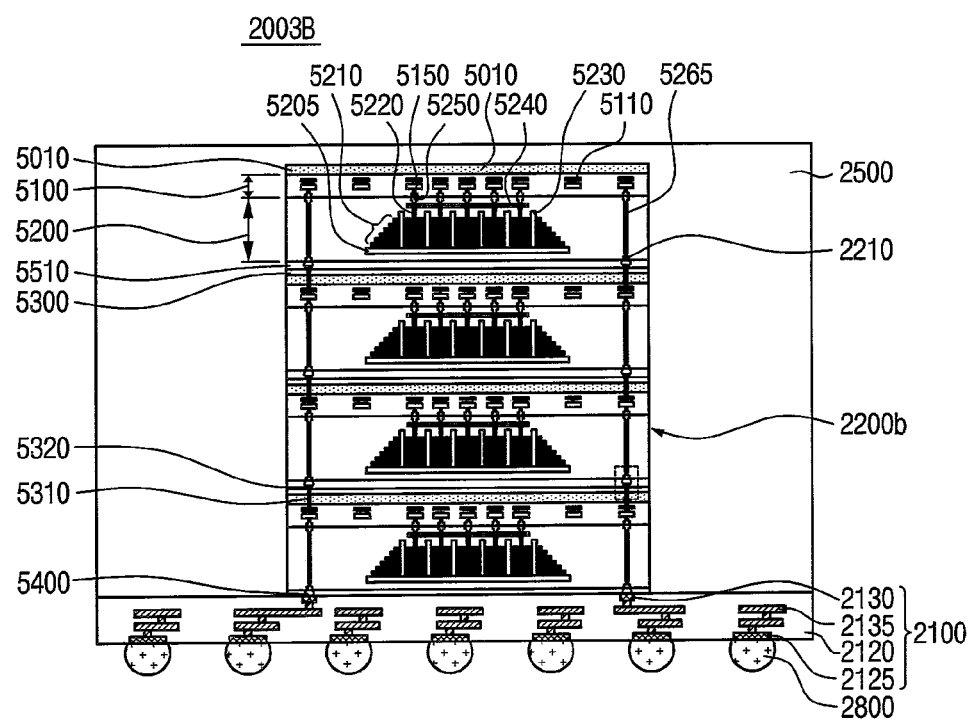
FIG. 25 is a schematic cross-sectional view of a semiconductor package in accordance with embodiments.

FIG. 25 is a schematic cross-sectional view of a semiconductor package in accordance with embodiments.

FIG. 25 illustrates an embodiment of a semiconductor package in FIG. 22, and conceptually shows a portion cut along a cut line of I-I' of a semiconductor package of FIG. 22.

Referring to FIG. 25, in some embodiments, a semiconductor package 2003B includes a plurality of semiconductor chips 2200b that are vertically aligned with each other. Each of the semiconductor chips 2200b includes a semiconductor substrate 5010, a first structure 5100 formed under the semiconductor substrate 5010, and a second structure 5200 formed under the first structure 5100. The first structure 5100 and the second structure 5200 are bonded to each other by a wafer bonding process.

In some embodiments, the first structure 5100 includes a peripheral circuit region in which a peripheral wiring 5110 and first bonding structures 5150 are formed. The first structure 5100 includes the first and second transistors described with reference to FIGS. 1 and 2.

In some embodiments, the second structure 5200 includes a common source line 5205, a cell stacked structure 5210 between the common source line 5205 and the first structure 5100, channel structures 5220 and the separation structures 5230 that pass through the cell stacked structure 5210, and second bonding structures 5250 electrically connected to the word lines (see FIG. 21, WL) of the cell stacked structure 5210 and the channel structures 5220. For example, the second bonding structures 5250 are electrically connected to the channel structures 5220 and the word lines (see FIG. 21, WL) through bit lines 5240 electrically connected to the channel structures 5220 and gate connection lines electrically connected to the word lines (see FIG. WL). The first bonding structures 5150 of the first structure 5100 and the second bonding structures 5250 of the second structure 5200 are bonded to each other. A bonding portion between the first bonding structures 5150 and the second bonding structures 5250 is formed of, e.g., copper (Cu).

In some embodiments, the semiconductor chips 2200b, except for an uppermost semiconductor chip, further include a backside insulation layer 5300 on the semiconductor substrate 5010, backside input/output pads 5320 on the backside insulation layer 5300, and through electrode structures 5310 that pass through the semiconductor substrate 5010 and the backside insulation layer 5300. The through electrode structures 5310 are electrically connected to the peripheral wirings 5110 of the first structure 5100 and the backside input/output pads 5320. Each of the through electrode structures 5310 includes a through electrode and an insulation spacer that surrounds a sidewall of the through electrode. The semiconductor package 2003B further includes connection structures 5400 disposed under each of the semiconductor chips 2200b. The connection structures 5400 include, e.g., conductive bumps. The connection structures 5400 are electrically connected to the semiconductor chips 2200b. Thus, the connection structures 5400 are electrically connected to the semiconductor chips 2200b and the package substrate 2100. An underfill material layer 5510 surrounds as sidewall of the connection structure 5400, e.g., conductive bumps.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:
1. A semiconductor device, comprising:
   a substrate that includes a first active region, a second active region, and an isolation region in a trench between the first and second active regions;
   an isolation layer pattern that fills the trench;

a first gate insulation layer pattern disposed on the substrate;

a first gate electrode structure disposed on the first gate insulation layer pattern, wherein the first gate electrode structure extends in a first direction and crosses the first active region, and wherein the first gate electrode structure includes a first polysilicon pattern, a second polysilicon pattern, and a first metal pattern that are sequentially stacked;

a second gate insulation layer pattern disposed on the substrate; and a second gate electrode structure disposed on the second gate insulation layer pattern, wherein the second gate electrode structure extends in the first direction and crosses the second active region, and wherein the second gate electrode structure including a third polysilicon pattern, a fourth polysilicon pattern, and a second metal pattern thin are sequentially stacked, wherein an upper surface of the isolation layer pattern is higher than an upper surface of each of the first and third polysilicon patterns, and a sidewall of each of the first and third polysilicon patterns contacts a sidewall of the isolation layer pattern, wherein the first gate insulation layer pattern and the second gate insulation layer pattern have different thicknesses, and wherein upper surfaces of the first gate insulation layer pattern and the second gate insulation layer pattern are substantially coplanar with each other.

2. The semiconductor device of claim 1, wherein
the first gate insulation layer pattern has a first thickness, and
the second gate insulation layer pattern has a second thickness that is less than the first thickness.

3. The semiconductor device of claim 1,
wherein the first gate insulation layer pattern is disposed on a first region of the substrate, the second gate insulation layer pattern is disposed on a second region of the substrate, and
wherein an upper surface of the first region of the substrate is lower than the upper surface of the second region of the substrate.

4. The semiconductor device of claim 1,
wherein the second polysilicon pattern and the first metal pattern are disposed on the upper surface of the first polysilicon pattern and on an upper sidewall and on the upper surface of the isolation layer pattern, and
wherein the fourth polysilicon pattern and the second metal pattern are disposed on the upper surface of the third polysilicon pattern and on the upper sidewall and on the upper surface of the isolation layer pattern.

5. The semiconductor device of claim 1,
wherein end portions in the first direction of the second polysilicon pattern and the first metal pattern are disposed on the upper surface of the isolation layer pattern, and
wherein end portions in the first direction of the fourth polysilicon pattern and the second metal pattern are disposed on the upper surface of the isolation layer pattern.

6. The semiconductor device of claim 1, wherein each of the first and third polysilicon patterns has a vertical thickness from about 100 Å to about 300 Å.

7. The semiconductor device of claim 1, wherein
the first polysilicon pattern has a vertical thickness that is less than 40% of a vertical thickness of the first gate electrode structure, and the third polysilicon pattern has a vertical thickness that is less than 40% of a vertical thickness of the second gate electrode structure.

8. The semiconductor device of claim 1, further comprising:
first impurity regions disposed on the first active region of the substrate adjacent to both sides of the first gate electrode structure;
second impurity regions disposed on the second active region of the substrate adjacent to both sides of the second gate electrode structure; and
contact plugs that contact the first and second impurity regions, respectively.

9. The semiconductor device of claim 1, wherein
each of the first and second active regions has art island shape, and each of the first and second active regions extends lengthwise in a second direction perpendicular to the first direction,
a plurality of first active regions are spaced apart in the first direction, and the first gate electrode structure extends in the first direction and crosses the plurality of first active regions, and
a plurality of second active regions are spaced apart in the first direction, and the second gate electrode structure extends in the first direction and crosses the plurality of second active regions.

10. The semiconductor device of claim 1, further comprising:
an insulating interlayer disposed on the substrate wherein the insulating interlayer covers the first and second gate electrode structures; and
memory cells disposed on the insulating interlayer.

11. A semiconductor device, comprising:
a substrate that includes a first region and a second region, wherein an upper surface of the first region of the substrate is lower than an upper surface of the second region of the substrate, and wherein the substrate includes a trench in at least a boundary region between the first and second regions;
an isolation layer pattern that fills the trench;
a first gate insulation layer pattern disposed on the first region of the substrate, wherein the first gate insulation layer pattern has a first thickness;
a second gate insulation layer pattern disposed on the second region of the substrate, wherein the second gate insulation layer pattern has a second thickness that is less than the first thickness;
a first gate electrode structure disposed on the first gate insulation layer pattern, wherein the first gate electrode structure includes a first polysilicon pattern, a second polysilicon pattern, and a first metal pattern that are sequentially stacked; and
a second gate electrode structure disposed on the second gate insulation layer pattern, wherein the second gate electrode structure includes a third polysilicon pattern, a fourth polysilicon pattern, and a second metal pattern that are sequentially stacked,
wherein an upper surface of the isolation layer pattern is disposed higher than an upper surface of each of the first and third polysilicon patterns,
wherein the second polysilicon pattern and the first metal pattern are disposed on an upper surface of the first polysilicon pattern and on an upper sidewall and on an upper surface of the isolation layer pattern, and
wherein the fourth polysilicon pattern and the second metal pattern are disposed on an upper surface of the third polysilicon pattern and on the upper sidewall and on the upper surface of the isolation layer pattern.

12. The semiconductor device of claim 11,
wherein end portions in a first direction of the second polysilicon pattern and the first metal pattern are disposed on the upper surface of the isolation layer pattern, and
wherein end portions in the first direction of the fourth polysilicon pattern and the second metal pattern are disposed on the upper surface of the isolation layer pattern.

13. The semiconductor device of claim 11, wherein each of the first and third polysilicon patterns has a vertical thickness from about 100 Å to about 300 Å.

14. The semiconductor device of claim 11, wherein
the first polysilicon pattern has a vertical thickness that is less than 40% of a vertical thickness of the first gate electrode structure, and
the third polysilicon pattern has a vertical thickness that is less than 40% of a vertical thickness of the second gate electrode structure.

15. The semiconductor device of claim 11, wherein upper surfaces of the first polysilicon pattern and the third polysilicon pattern are substantially flat.

16. A semiconductor device, comprising:
a substrate that includes active regions and an isolation region at a trench between the active regions;
an isolation layer pattern that fills the trench;
a first gate insulation layer pattern disposed on a first region of the substrate;
a first gate electrode structure disposed on the first gate insulation layer pattern, wherein the first gate electrode structure extends in a first direction and crosses at least one of the active regions, and the first gate electrode structure includes a first polysilicon pattern, a second polysilicon pattern, and a first metal pattern that are sequentially stacked;
a second gate insulation layer pattern disposed on a second region of the substrate; and
a second gate electrode structure disposed on the second gate insulation layer pattern, wherein the second gate electrode structure extends in the first direction and crosses at least one of the active regions, and the second gate electrode structure includes a third polysilicon pattern, a fourth polysilicon pattern, and a second metal pattern that are sequentially stacked,
wherein each of the first and third polysilicon patterns is cut by the isolation layer pattern,
wherein end portions in the first direction of the second polysilicon pattern and the first metal pattern are disposed on the upper surface of the isolation layer pattern, and
wherein end portions in the first direction of the fourth polysilicon pattern and the second metal pattern are disposed on the upper surface of the isolation layer pattern.

17. The semiconductor device of claim 16, wherein
the first gate insulation layer pattern has a first thickness, and
the second gate insulation layer pattern has a second thickness that is less than the first thickness.

18. The semiconductor device of claim 17, wherein each of the first and third polysilicon patterns has a vertical thickness from about 100 Å to about 300 Å.

19. The semiconductor device of claim 17, wherein
the first polysilicon pattern has a vertical thickness that is less than 40% of a vertical thickness of the first gate electrode structure, and
the third polysilicon pattern has a vertical thickness that is less than 40% of a vertical thickness of the second gate electrode structure.

* * * * *